US011801864B1

(12) United States Patent
Arora et al.

(10) Patent No.: US 11,801,864 B1
(45) Date of Patent: Oct. 31, 2023

(54) COST-BASED ACTION DETERMINATION

(71) Applicant: Zoox, Inc., Foster City, CA (US)

(72) Inventors: Akash Arora, San Mateo, CA (US); Max Gier, Aachen (DE); Moritz Harmel, San Francisco, CA (US)

(73) Assignee: Zoox, Inc., Foster City, CA (US)

( * ) Notice: Subject to any disclaimer, the term of this patent is extended or adjusted under 35 U.S.C. 154(b) by 263 days.

(21) Appl. No.: 17/202,795

(22) Filed: Mar. 16, 2021

(51) Int. Cl.
*B60W 60/00* (2020.01)

(52) U.S. Cl.
CPC .... *B60W 60/0011* (2020.02); *B60W 60/0013* (2020.02); *B60W 60/0015* (2020.02); *B60W 60/0027* (2020.02); *B60W 2554/80* (2020.02); *B60W 2720/10* (2013.01)

(58) Field of Classification Search
CPC ......... B60W 60/0011; B60W 60/0013; B60W 60/0015; B60W 60/0027; B60W 2554/80; B60W 2720/10
See application file for complete search history.

(56) References Cited

U.S. PATENT DOCUMENTS

| | | | |
|---|---|---|---|
| 2020/0063667 A1* | 2/2020 | Lenk | F01M 11/10 |
| 2021/0114617 A1* | 4/2021 | Phillips | B60W 30/0956 |
| 2021/0271249 A1* | 9/2021 | Kobashi | G05D 1/0214 |
| 2022/0204056 A1* | 6/2022 | Russell | B60W 60/00272 |

FOREIGN PATENT DOCUMENTS

WO   WO-2019089591 A1 *  5/2019  ............ B60W 30/09

* cited by examiner

*Primary Examiner* — Anne Marie Antonucci
*Assistant Examiner* — Jordan T Smith
(74) *Attorney, Agent, or Firm* — Lee & Hayes, P.C.

(57) ABSTRACT

A vehicle computing system may implement techniques to determine an action for a vehicle to perform based on a cost associated therewith. The cost may be based on a detected object (e.g., another vehicle, bicyclist, pedestrian, etc.) operating in the environment and/or a possible object associated with an occluded region (e.g., a blocked area in which an object may be located). The vehicle computing system may determine two or more actions the vehicle could take with respect to the detected object and/or the occluded region and may generate a simulation associated with each action. The vehicle computing system may run the simulation associated with each action to determine a safety cost, a progress cost, a comfort cost, an operational rules cost, and/or an occlusion cost associated with each action. The vehicle computing system may select the action for the vehicle to perform based on an optimal cost being associated therewith.

20 Claims, 7 Drawing Sheets

COST-BASED ACTION DETERMINATION

BACKGROUND

Planning systems in autonomous and semi-autonomous vehicles determine actions (e.g., a path, one or more speeds, etc.) for a vehicle to take in an operating environment. Actions for a vehicle may be determined based in part on avoiding objects present in the environment. For example, an action may be generated to yield to an object at a junction, proceed ahead of the object, or the like. Traditional planning systems may choose an action for the vehicle based on a determination that the action is a most conservative action. However, a most conservative action may not necessarily be a safest action, in addition to impacting passenger comfort and expectations without any additional safety.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
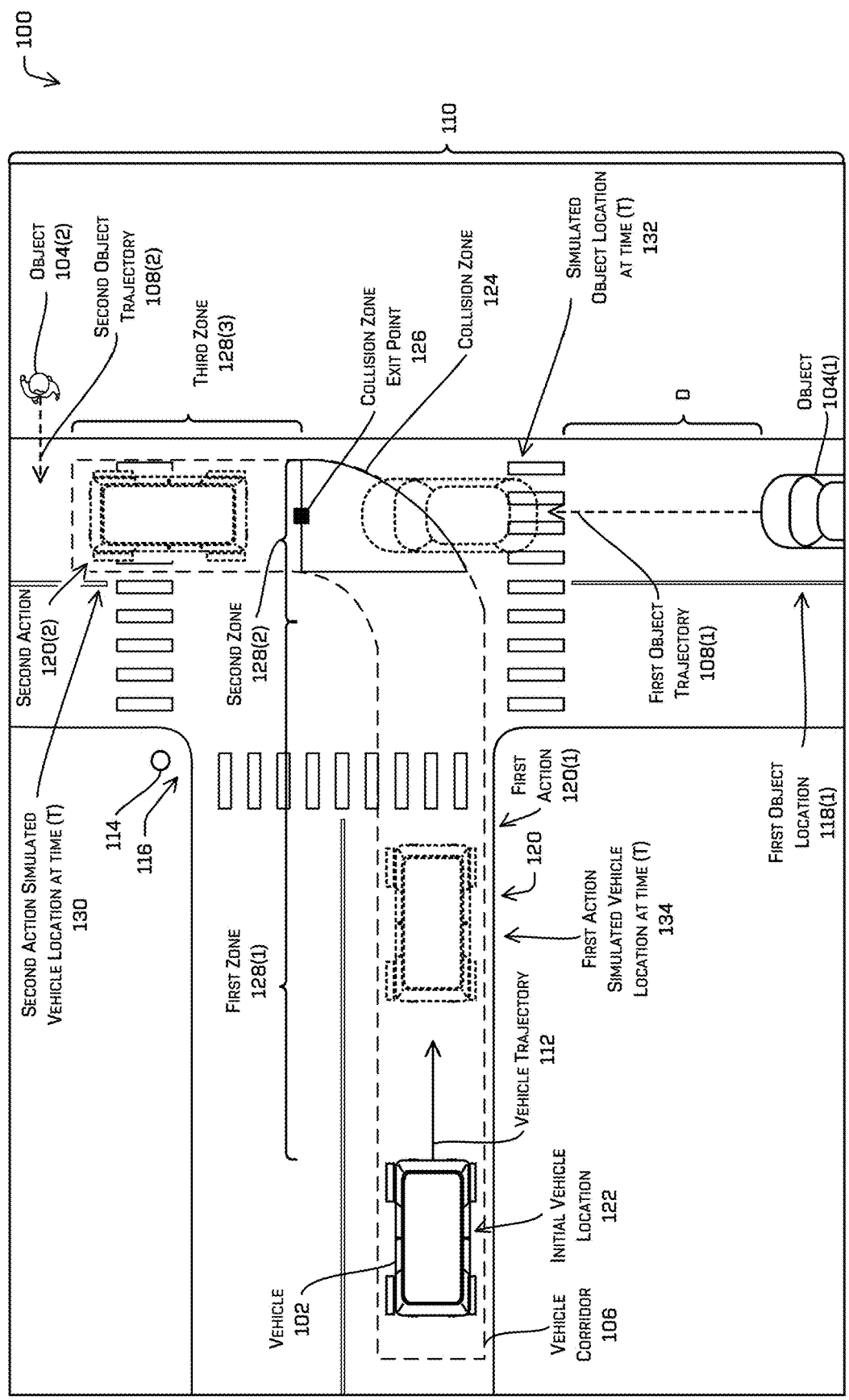
FIG. 1 depicts a vehicle in an environment, in which an example cost-based action determination system may be utilized to determine an action for the vehicle to perform in the environment, in accordance with examples of the disclosure.

This application relates to techniques for dynamically determining an action for a vehicle to take (e.g., a path to travel) at a junction (e.g., intersection) based on a cost associated with the action. The cost may be based on safety (e.g., avoiding the vehicle and the object being within a threshold distance of one another), comfort (e.g., lack of abrupt movements), progress (e.g., movement toward destination), operating rules (e.g., rules of the road, laws, codes, regulations, etc.), an occlusion (e.g., a blocked area in which an object may be located), and/or the like. A vehicle computing system may detect an object (e.g., another vehicle, bicyclist, pedestrian, etc.) operating in an environment proximate the junction associated with the vehicle and may determine an object trajectory associated with the object. The vehicle computing system may determine two or more actions the vehicle could perform based at least in part on the object trajectory and a cost associated with each candidate action. In various examples, the vehicle computing system may select the action to perform based on an optimal cost (e.g., a lowest cost, a highest cost, a cost being below a threshold, etc.) associated therewith.

The vehicle may include an autonomous or semi-autonomous vehicle with a vehicle computing system configured to detect one or more objects in the environment. The objects may include static objects (e.g., buildings, bridges, signs, etc.) and dynamic objects such as other vehicles (e.g., cars, trucks, motorcycles, mopeds, etc.), pedestrians, bicyclists, or the like. Unless indicated to the contrary, the term "object" herein refers to a dynamic object. In some examples, the objects may be detected based on sensor data from sensors (e.g., cameras, motion detectors, lidar, radar, time of flight, etc.) of the vehicle. In some examples, the objects may be detected based on sensor data received from remote sensors, such as, for example, sensors associated with another vehicle or sensors mounted in the environment that are configured to share data with a plurality of vehicles. In some examples, the vehicle computing system may be configured to semantically classify the detected objects. A classification may include another vehicle (e.g., car, a pick-up truck, a semi-trailer truck, a tractor, a bus, a train, etc.), a pedestrian, a bicyclist, an equestrian, or the like. For example, the vehicle computing system may detect two objects and classify a first object as a car and a second object as a pick-up truck.

In various examples, the vehicle computing system may determine two or more actions the vehicle could perform while operating in the environment with the detected objects. The actions may represent two or more potential paths the vehicle could take through the environment (e.g., two or more vehicle trajectories). The actions may include at least two reference actions (e.g., maneuvers the vehicle is configured to perform in reaction to a dynamic operating environment). The reference actions may include at least a first action of yielding to an object and a second action of proceeding along a vehicle path ahead of the object. The actions may additionally include one or more sub-actions, such as speed variations (e.g., maintain velocity, accelerate, decelerate, etc.), positional variations (e.g., changing a position in a lane), or the like. For example, an action may include proceeding along a vehicle path (reference action) and adjusting a position of the vehicle in a lane from a centered position to operating on a left side of the lane (sub-action). For another example, a first action may include proceeding along the vehicle path ahead of the object (reference action) according to a first acceleration profile (sub-action) and a second action may include proceeding along the vehicle path ahead of the object (reference action) according to a second acceleration profile (sub-action). As used herein, an action may include a reference action and at least one sub-action.

In various examples, the vehicle computing system may be configured to determine actions that are applicable to the vehicle in the environment. For example, accelerating to proceed on a vehicle path ahead of an object may not be an applicable action for a vehicle operating at a speed limit. In various examples, the vehicle computing system may be configured to determine a number of actions (e.g., 2, 4, 6, 7, etc.) for the vehicle to perform in a particular scenario in the environment. In some examples, the number of actions for the vehicle to perform may be pre-defined. In various examples, the pre-defined number of actions may be based at least in part on the particular scenario in the environment. For example, the vehicle computing system may determine five (5) actions associated with a perpendicular four-way junction with crossing traffic, in which the vehicle path continues straight through the junction. For another example, the vehicle computing system may determine three (3) actions associated with a T-junction at which the vehicle path turns left into a lane in which an object is operating toward the junction. Though these are merely illustrative examples and are not intended to be so limiting.

In various examples, the vehicle computing system may be configured to determine actions based on heuristics and other semantic information associated with the environment 100, such as that determined based on sensor data. In some examples, the vehicle computing system may be configured to determine the actions such that even if noise (and/or flickering) was associated with a prediction component configured to predict object actions and/or reactions, the vehicle computing system would default toward a safe action. In such examples, the vehicle computing system may ensure the safety of the vehicle 102 in the environment.

In various examples, the vehicle computing system may be configured to determine an initial location of each detected object in the environment. In various examples, the vehicle computing system may determine one or more predicted trajectories associated with each detected object, such as from an initial location associated therewith. In some examples, the one or more predicted trajectories may be determined based on the sensor data. Each predicted trajectory may represent a potential path that the detected object may travel through the environment. The one or more predicted trajectories may be based on predicted reactions of the object to the vehicle action (e.g., active prediction). For example, an action may include the vehicle turning at a junction into a lane in which another vehicle is currently operating. The vehicle computing system may determine that a predicted trajectory of the other vehicle may include a slight negative acceleration (deceleration) to provide space for the vehicle to perform the maneuver.

In some examples, the one or more predicted trajectories may be determined using a probabilistic heat map (e.g., discretized probability distribution) to predict object behavior, such as that described in U.S. patent application Ser. No. 15/807,521, filed Nov. 8, 2017, and entitled "Probabilistic Heat Maps for Behavior Prediction," the entire contents of which are incorporated herein by reference. In some examples, the one or more predicted trajectories may be based on a top-down representation of an environment by utilizing techniques such as those described in U.S. patent application Ser. No. 16/151,607 filed Oct. 4, 2018 and entitled "Trajectory Prediction on Top-Down Scenes," and in U.S. patent application Ser. No. 16/504,147 filed Jul. 5, 2019 and entitled "Prediction on Top-Down Scenes based on Action Data," the entire contents of which are incorporated herein by reference. In various examples, the one or more predicted trajectories may be determined utilizing tree search methods, temporal logic formulae, and/or machine learning techniques.

In various examples, the vehicle computing system may determine, based at least in part on an initial location of a detected object and/or a predicted trajectory associated therewith, an action for the vehicle to perform (e.g., whether to yield to the detected object or to proceed ahead). In various examples, a determination to yield to an object approaching a junction associated with the vehicle may be based on an initial location of the object being within a first (minimum) threshold distance of the vehicle and/or the junction (e.g., intersection) associated therewith. For example, an object with a right of way over a vehicle proceeding toward a four-way intersection may be at a location that is ten (10) meters from the intersection. The vehicle computing system may determine that the location of the object is less than a first threshold distance from the intersection and may determine to yield. In various examples, a determination to proceed ahead of an object approaching a junction associated with the vehicle may be based on an initial location of the detected object being equal to or greater than a second (maximum) threshold distance from the vehicle and/or the junction. For example, an object with a right of way over a vehicle proceeding toward a four-way intersection may be at a location that is forty (40) meters from the intersection. The vehicle computing system may determine that the location is equal to or greater than the second threshold distance from the intersection and may determine to proceed ahead of the object through the intersection. Of course, though such thresholds are described above with respect to distances, similar temporal thresholds may be determined in addition to or alternative to the distance thresholds. For instance, a minimum and maximum time threshold may be determined based on the predicted actions and/or associated velocities of the object and the vehicle.

In various examples, the vehicle computing system may determine that the object is between the minimum threshold distance and the maximum threshold distance. In some examples, based on the object location being between the minimum and maximum threshold distances, the vehicle computing system may determine the action to perform based on a cost associated with each action. In various examples, the vehicle computing system may be configured to determine the cost based on a simulation associated with each action. In such examples, the vehicle computing system may generate a simulation for each of the actions based on sensor data associated with the environment. For each action, the vehicle computing system may run the simulation with a simulated vehicle performing the respective action and determine a cost associated therewith.

In various examples, the simulation may include one or more detected objects traveling through the environment based in part on the predicted object trajectories associated therewith. In various examples, the simulation may include detected object(s) that are located within a threshold distance of the vehicle and/or junction associated therewith. In at least one example, the simulation may include a first object located proximate the junction associated with the vehicle. The first object may include a crossing or merging object that is approaching the junction and is located between the minimum threshold distance and maximum threshold distance of the junction.

In various examples, the vehicle computing system may perform the simulation and may determine a cost associated with each action. In some examples, the vehicle computing system may determine the cost associated with each action utilizing techniques such as those described in U.S. patent application Ser. No. 16/539,928, filed Aug. 13, 2019 and entitled "Cost-Based Path Determination," the entire contents of which are incorporated herein by reference.

In various examples, the cost may include a safety cost (e.g., cost associated with determined distance between the object and the vehicle). In at least one example, the vehicle computing system may determine the safety cost based on a heat map generated based on one or more predicted distances between the vehicle and the first object in the simulation. The predicted distances may represent distances between the vehicle and the first object at one or more future times. In various examples, the distances at the respective times may be based on one or more acceleration profiles associated with the object. In at least one example, the acceleration profile(s) may include a minimum acceleration profile (e.g., a minimum rate of acceleration or deceleration) and a maximum acceleration profile (e.g., a maximum rate of acceleration or deceleration) predicted for the first object.

In various examples, at each future time in the simulation, the vehicle computing system may determine the distances between the vehicle and the first object based on the acceleration profiles and may generate a heat map associated with the distances. The heat map may represent one or more projected distances between the vehicle and the first object at a given future time in the simulation. In some examples, the heat map may represent the projected distance(s) based on a probability that the object will travel according to the acceleration profile(s). Based at least in part on the projected distances, the vehicle computing system may determine the safety cost. For example, based on a determination that a first object remains a first distance away from the vehicle performing a first action in the simulation, the vehicle computing system may determine a first safety cost. For another example, based on a determination that the first object comes within a second distance of the vehicle performing a second action at a particular time in the future, the vehicle computing system may determine a second safety cost that is greater than the first safety cost.

In various examples, the cost may include a comfort cost (e.g., cost associated with abrupt movements). The comfort cost may be based on an estimated acceleration (e.g., positive, negative, lateral, etc.) associated with the object and/or vehicle caused by the vehicle action. In some examples, the comfort cost may be based on the value associated with the acceleration. For example, a 2 foot per second per second acceleration (e.g., 2 feet per second$^2$) may result in a comfort cost of 2. Of course, examples of acceleration values and/or costs are not intended to be limiting, and other values and/or costs are contemplated herein. In some examples, the comfort cost may be based on lateral and/or longitudinal jerk and/or a higher order derivative of acceleration. In some examples, the comfort cost may be based on an estimated closest distance between the vehicle and the first object at a particular time in the simulation. For example, a first action in which the vehicle and the first object are projected to be a first distance from one another at a closest point of approach may have associated therewith a first comfort cost and a second action in which the vehicle and the first object are projected to be a second distance from one another at the closest point of approach may have associated therewith a second comfort cost that is different from the first comfort cost.

In various examples, the cost may include a progress cost (e.g., cost associated with movement toward a destination). In some examples, the progress cost may be calculated based on a change in velocity of the vehicle and/or the object (e.g., to slow down, stop, etc.) and/or a delay of vehicle movement toward a destination, such as to avoid a collision (e.g., waiting at a stop sign, yielding prior to a junction, etc.). In various examples, the progress cost may include a value substantially similar to the delay attributed to the estimated state. For example, an action may include the vehicle waiting at an intersection for eleven seconds while an object approaches and passes through the intersection. The progress cost associated with the action may include a value of eleven (11), although other values are contemplated herein.

In some examples, the cost may include an operational rules cost (e.g., cost associated with rules of the road, laws, codes, regulations, etc.). The operational rules cost may be based on rules of the road (e.g., department of transportation laws, codes, regulations, etc.), rules of good driving, regional driving habits (e.g., common driving practices), driving courtesies (e.g., adjusting a position in a lane to provide space for another car to pass for a right-hand turn, not occupying a bike lane, etc.). In various examples, the operational rules cost associated with an action (e.g., a simulation) may be calculated based on one or more rules that are broken and/or satisfied. In such examples, the operational rules cost may be increased based on rules (e.g., rules, habits, courtesies, etc.) that are broken or unfulfilled and/or decreased based on rules that are satisfied or fulfilled. For example, an action may include a vehicle adjusting a position in a lane to the left side while coming to a stop at a red light. The adjusted position may provide space for another vehicle behind to drive next to the vehicle and perform a right-hand turn without having to wait for the light to turn green. The courtesy of adjusting a position may incur a reward of −3 (e.g., decreased the total cost associated with the estimated state).

Additionally or in the alternative, the cost may include an occlusion cost associated with an occluded region. In various examples, the vehicle computing system may be configured to identify an occlusion zone (e.g., also referred to as an occluded region) in which a view of at least a portion of the environment (which may include oncoming traffic) may be blocked, such as by an obstacle. The occlusion zone may define a region in which the vehicle computing system may not be able to detect objects. In various examples, the vehicle computing system may be configured to identify the relevant section of road associated with the occlusion zone. In such examples, the section of road may include one or more lanes, sidewalks, bike lanes, etc. configured for objects to operate in a direction that may be relevant to the vehicle. For example, the occlusion zone may include two lanes of a road in which objects may travel toward the vehicle. In such an example, any additional lanes of the road in which objects travel in a direction away from the vehicle may be not included in the occlusion zone.

In various examples, the vehicle computing system may generate the simulation associated with each action with an occluded object located in the occlusion zone. In such examples, the occluded object may not be generated based on sensor data, but instead may include a potential object that may or may not be located in the occlusion zone. In some examples, the occluded object may be generated at a location within the occlusion zone that is a closest location to the vehicle and/or the junction. In some examples, the vehicle computing system may determine one or more predicted object trajectory associated with the occluded object based on a speed limit of the road, stored data associated with previously detected objects in the occlusion zone, acceleration profiles, or the like. In such examples, the vehicle computing system may determine predicted future locations of the occluded object based on the predicted object trajectories.

In various examples, the vehicle computing system may determine the occlusion cost based on a speed of the vehicle (e.g., independent of a predicted object trajectory) and one or more penalties associated with the vehicle speed. In some examples, the vehicle computing system may determine the occlusion cost based on a progression penalty associated with the vehicle crossing in front of the occlusion zone. In some examples, the progression penalty may be determined by multiplying a squared vehicle speed by the time associated with the vehicle being within a collision zone between the vehicle and the occluded object. In various examples, the progression penalty may increase substantially as the vehicle speed increases, such as to decrease a probability that the vehicle will progress at an unsafe speed in front of an occlusion zone. In various examples, such an occlusion cost may be based on a size of the occluded area (or predicted occluded area) given the vehicle trajectory and predicted object(s) trajectory(ies). In such examples, higher occlusion costs may be penalized.

In some examples, the vehicle computing system may determine the occlusion cost based on a blocking penalty associated with the vehicle occupying space in front of the occlusion zone for a period of time. In some examples, the vehicle computing system may determine the blocking penalty by multiplying the vehicle speed by the time associated with the vehicle being within a collision zone between the vehicle and the occluded object. In various examples, the occlusion cost may include a sum of the progression penalty and the blocking penalty. In some examples, the occlusion cost may include the sum of the progression penalty and the blocking penalty multiplied by a probability that the action will affect the occluded object's travel. In some examples, the probability may be determined based on a distance between the occluded object (e.g., the occlusion zone) and the collision zone. In some examples, the probability may additionally be determined based on a predicted object trajectory of the occluded object. In various examples, the probability may be based in part on a time associated with the occluded object traveling from the occlusion zone to the collision zone.

In various examples, the vehicle computing system may determine that one or more of the safety cost, the comfort cost, the progress cost, the operational rules cost, or the occlusion cost associated with a simulation exceeds a threshold cost. In such examples, the vehicle computing system may determine to terminate the simulation prior to completion of the simulation and may remove the associated action from vehicle control planning considerations. For example, the vehicle computing system may determine, prior to the simulated vehicle traveling through a junction in the simulation, that an action would likely result in a collision between the vehicle and the object. The vehicle computing system may determine that the safety cost is greater than a threshold safety cost and may thus terminate the simulation prior to completion. The vehicle computing system may remove the associated action from vehicle control planning considerations. In various examples, terminating the simulation prior to the completion thereof my increase processing power available for the vehicle computing system to perform other calculations, such as running alternative simulations associated with different actions. In such examples, the techniques described herein may improve the performance of the vehicle computing system.

In various examples, the vehicle computing system may determine a total cost associated with each action based on one or more of the safety cost, the comfort cost, the progress cost, the operational rules cost, and the occlusion cost. In some examples, the vehicle computing system may compare the total costs of each action and may select the action associated with the optimal cost. The optimal cost may include a lowest cost or a highest cost, based on scoring parameters (e.g., highest being best, lowest being best, etc.). The vehicle computing system may determine to perform the action associated with the optimal cost and may control the vehicle through the environment according to the action.

The techniques discussed herein may improve a functioning of an autonomous and/or semi-autonomous vehicle in a number of ways. Traditionally, a vehicle computing system of an autonomous or semi-autonomous vehicle detects a crossing or merging object (e.g., at a junction) in an environment and controls the vehicle according to a most conservative action, which is to yield for the object, oftentimes regardless of a right of way. These traditional systems may result in unnecessary and unnatural yielding situations, which may cause traffic delays. The techniques described herein solve the problem of unexpected yields and improve the functioning of the vehicles (and improve traffic flow) by determining an optimal, safe action for the vehicle to perform in an environment. Based on a determination that the vehicle can safely proceed through an intersection ahead of a crossing or merging object, the vehicle computing system may determine to proceed along a vehicle path, thereby not creating traffic delays caused by unexpected yields.

Additionally, the techniques described herein include generating simulations to determine an optimal action for the vehicle to perform based on the totality of the circumstances in the environment. In examples in which a detected object is equal to or less than a first threshold distance or equal to or greater than a second threshold distance from the vehicle and/or a junction associated therewith, the vehicle computing system may automatically determine the action to perform, such as without performing the simulation. As such, the techniques described herein may improve the functioning of the vehicle computing system by running simulations for applicable scenarios. Further, the techniques described herein ensure that the vehicle may safely proceed without a possibility of collision with an object, whether visible to the vehicle or located in an occluded region. Accordingly, the vehicle computing system may control the vehicle through the environment, ensuring the safe operation thereof. These and other improvements to the functioning of autonomous and/or semi-autonomous vehicles are discussed herein and may, in some instances, be achieved using the techniques described herein.

The techniques described herein may be implemented in a number of ways. Example implementations are provided below with reference to the following figures. Although discussed in the context of an autonomous vehicle, the methods, apparatuses, and systems described herein may be applied to a variety of systems (e.g., a sensor system or a robotic platform), and are not limited to autonomous vehicles. In another example, the techniques may be utilized in an aviation or nautical context, or in any system using machine vision (e.g., in a system using image data). Additionally, the techniques described herein may be used with real data (e.g., captured using sensor(s)), simulated data (e.g., generated by a simulator), or any combination of the two.

FIG. 1 is an illustration of a vehicle 102 and two objects 104 (e.g., a first object 104(1) and a second object 104(2)) in an environment 100, wherein a vehicle corridor 106 associated with the vehicle 102 and estimated object trajectories 108 are overlaid in the illustration representing a two-dimensional map 110 of the environment 100 generated by a cost-based action determination system of the autonomous vehicle 102 (vehicle 102). A vehicle computing device may perform the cost-based action determination system of the vehicle 102. While described as a separate system, in some examples, the cost-based action determination techniques described herein may be implemented by other vehicle systems, components, and/or computing devices. For example, and as will be described in further detail with regard to FIG. 5, the cost-based action determination techniques described herein may be implemented at least partially by or in associated with a planning component 524.

In various examples, the vehicle computing device may generate the vehicle corridor 106 of the vehicle 102. In various examples, the vehicle corridor 106 may be determined based on a vehicle trajectory 112 (e.g., speed, acceleration, direction of travel, etc.). In some examples, the vehicle corridor 106 may be determined based on one or more maps of the environment 100. In such examples, the vehicle computing system may access one or more maps and determine the vehicle corridor 106 based on the map(s). In some examples, the vehicle corridor 106 may represent a two-dimensional representation of a planned path of the vehicle 102 through the environment 100. The vehicle corridor 106 may include an area defined by a width of the vehicle and/or a buffer region (e.g., 1 foot, 1 meter, etc.) on either side of the vehicle 102 and a distance in front of and/or behind the vehicle 102. In some examples, the vehicle corridor 106 may include a path polygon. In such examples, the path polygon may be generated utilizing the techniques such as those described in U.S. patent application Ser. No. 16/539,928, which is incorporated herein by reference above.

In various examples, the vehicle computing system may be configured to detect one or more objects 104 in the environment 100. The vehicle computing system may detect the object(s) 104 based on sensor data received from one or more sensors. In some examples, the sensor(s) may include sensors mounted on the vehicle 102, such as, for examples, cameras, motion detectors, lidar, radar, etc. In some examples, the sensor(s) may include one or more remote sensors, such as, for example sensors mounted on another vehicle and/or sensors 114 mounted in the environment 100. In various examples, vehicle 102(1) may be configured to transmit and/or receive data from vehicle 102(2) and/or sensors 114. The data may include sensor data, such data regarding objects(s) 104 identified in the environment 100.

In various examples, the environment 100 may include sensors 114 for traffic monitoring, collision avoidance, or the like. In some examples, the sensors 114 may be mounted in the environment 100 to provide additional visibility in an area of reduced visibility, such as, for example, in a blind or semi-blind junction (e.g., intersection). For example, a junction 116 in the environment 100 may be determined to have a blind intersection, where approaching vehicles 102 may not be able to perceive objects 104 and/or other vehicles approaching from the left or right on the intersecting road. The junction 116 may thus include a sensor 114 to provide sensor data to an approaching vehicle 102 regarding a first object 104(1) approaching the junction 116 from the intersecting road and/or a second object 104(2) located proximate the junction 116.

In various examples, the vehicle computing system may receive the sensor data and may determine a type of object 104 (e.g., classify the type of object), such as, for example, whether the object 104 is a car, truck, motorcycle, moped, bicyclist, pedestrian, or the like. In various examples, the vehicle computing system may determine the one or more predicted trajectories 108 associated with an object 104 based on the sensor data and/or the type of object 104. In some examples, the trajectories 108 may include any number of possible paths in which the object 104 may travel from a current location (e.g., first object location 118(1)) and/or based on a direction of travel. In the illustrative example, the object 104(1) continues straight in a first object trajectory 108(1). However, in other examples, a number of trajectories may greater than one, including, but not limited to, a continuous representation of all possible trajectories (e.g., left turn, right turn, etc.). In some examples, the number of trajectories may vary depending on a variety of factors, such as the classification of the object (e.g., type of object), other stationary and/or dynamic objects, drivable surfaces, etc.

In some examples, the one or more predicted object trajectories 108 may be determined utilizing techniques such as those described in U.S. patent application Ser. Nos. 15/807,521, 16/151,607, and 16/504,147, which are incorporated herein by reference above. In various examples, the one or more predicted trajectories may be determined utilizing tree search methods, temporal logic formulae, and/or machine learning techniques.

Figure 3:
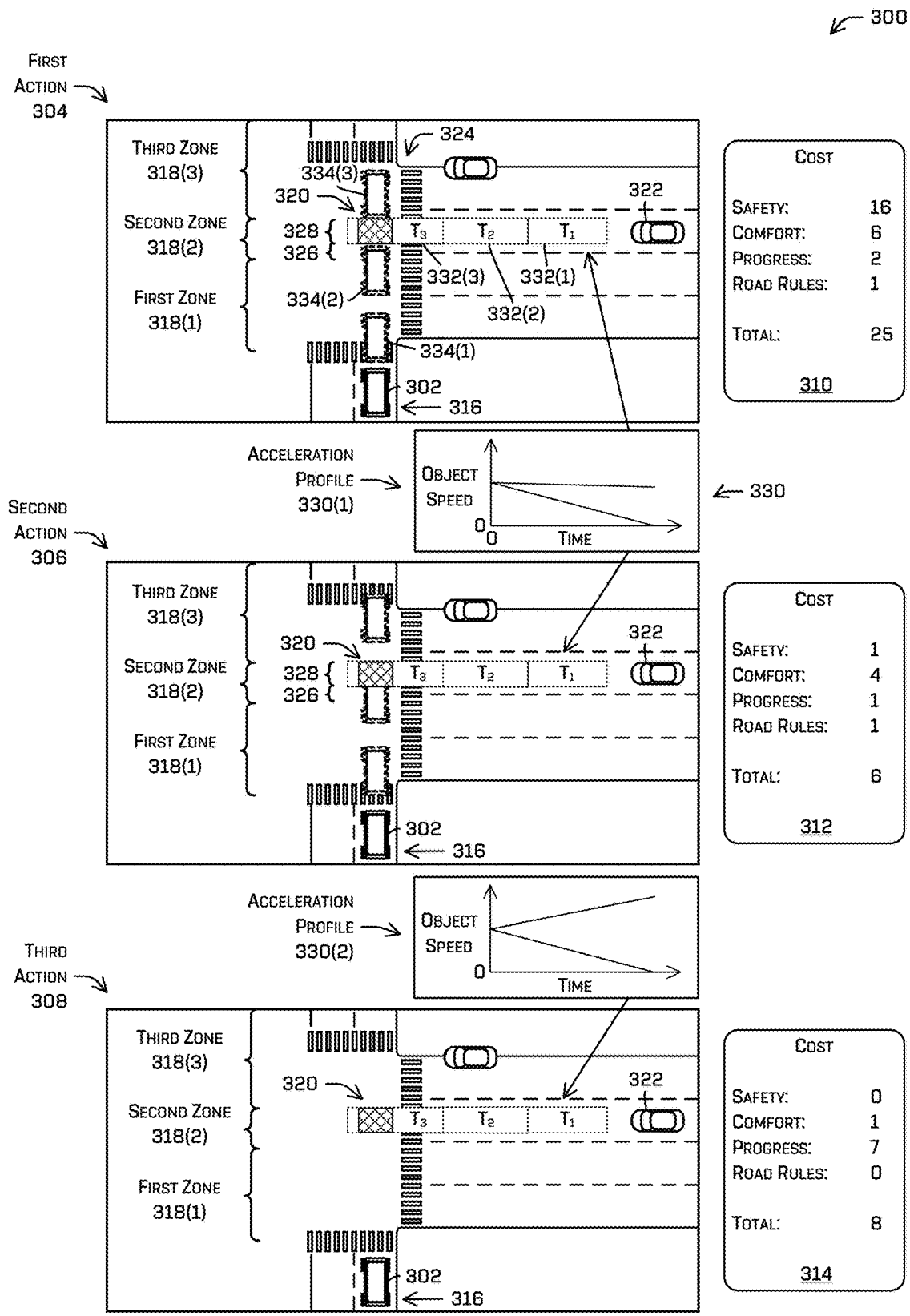
FIG. 3 depicts illustrations of various candidate actions for a vehicle to perform in an environment and calculated costs associated with each candidate action, in accordance with examples of the disclosure.

In various examples, the vehicle computing system may determine that a predicted object trajectory 108 includes a crossing or merging trajectory (e.g., first object trajectory 108(1)). A crossing trajectory may include an object trajectory 108 that crosses the path of the vehicle 102. An example crossing trajectory is illustrated in FIG. 3 and described below. A merging trajectory may include an object trajectory 108 that merges into the path of the vehicle 102, such that the vehicle 102 and a merging object (e.g., the first object 104(1)) may share a same lane. In various examples, the vehicle computing system may determine the object trajectory 108(1) is a crossing or merging trajectory based on a determination that the vehicle corridor 106 associated with the vehicle trajectory 112 (e.g., planned path of the vehicle 102) intersects and crosses or merges with the object trajectory 108(1).

In various examples, the vehicle computing system may determine, based at least in part on an initial location of a detected object 104 (e.g., first object location 118(1)) and/or a predicted trajectory 108 associated therewith, an action 120 for the vehicle to perform (e.g., whether to yield to the detected object or to proceed ahead). In various examples, the vehicle computing system may determine to yield to the first object 104(1) approaching the junction 116 (e.g., perform the first action 120(1)) based on a determination that a distance (D) between the first object location 118(1) and the junction 116 is equal to or less than a first (minimum) threshold distance. In some examples, the first threshold distance may represent a distance from the first object location 118(1) to the initial vehicle location 122.

In various examples, the vehicle computing system may determine to proceed ahead of the first object 104(1) approaching the junction 116 (e.g., perform the second action 120(2)) based on a determination that the distance (D) between the first object location 118(1) and the junction 116 is equal to or greater than a second (maximum) threshold distance. In some examples, the second threshold distance may represent a distance from the first object location 118(1) to the initial vehicle location 122.

In various examples, the vehicle computing system may determine the first threshold distance and/or the second threshold distance based on an object speed. In some examples, the speed may include a speed associated with the object trajectory 108. In some examples, the speed may include a speed associated with the road, such as a speed limit or the like. In some examples, the first threshold distance may be determined based on a distance that the object 104 would travel at the speed for a time associated with the vehicle 102 exiting a collision zone 124 between the vehicle 102 (e.g., passing a collision zone exit point 126)

and the object 104 while proceeding according to the vehicle trajectory 112. In some examples, the first threshold distance may additionally include a safety buffer to ensure a safe operation of the vehicle 102. In examples in which the object 104 is a merging object, such as the first object 104(2), the first threshold distance may be based on a distance associated with the object traveling at the speed for a time associated with the vehicle merging into the object path and accelerating to substantially match the speed associated with the road.

In some examples, the second threshold distance may be determined based on the first threshold distance plus an additional safety buffer. In at least one example, the second threshold distance may represent a distance that that enables the vehicle to proceed through the junction 116 with little to no likelihood of collision with the object 104.

In various examples, the vehicle computing system may determine that the first object location 118(1) is greater than the first threshold distance and less than the second threshold distance. Based in part on a determination that the first object location 118(1) is between the first threshold distance and the second threshold distance, the vehicle computing system may determine two or more actions 120 for the vehicle 102 to perform while operating in the environment with the detected objects 104. The action(s) 120 may represent two or more potential paths the vehicle 102 could take through the environment 100 (e.g., one or more vehicle trajectories). In some examples, the action(s) 120 may be determined based on the detected objects 104. For example, the vehicle computing system may detect one or more objects 104, such as the first object 104(1) approaching the junction 116 from the right. The vehicle computing system may determine a first action 120(1) may include yielding to the first object 104(1) and a second action 120(2) may include proceeding ahead of the first object 104(1) at the junction 116.

In various examples, the actions 120 may include two or more reference actions (e.g., one of a group of maneuvers the vehicle 102 is configured to perform in reaction to a dynamic operating environment) such as yielding to an object 104, staying in a lane, going around an obstacle (e.g., double-parked vehicle, traffic cones, etc.), performing a lane change, or the like. The action(s) 120 may additionally include one or more sub-actions, such as speed variations (e.g., maintain velocity, accelerate, decelerate, etc.), positional variations (e.g., changing a position in a lane), or the like. For example, an action 120, such as second action 120(2), may include staying in a lane (reference action) and accelerating from an initial vehicle location 122 at a first acceleration (sub-action), whereas a third action (not illustrated) may include staying in the lane (reference action) and accelerating from the initial vehicle location 122 at a second acceleration (sub-action).

In various examples, the two or more actions 120 may be determined based on the initial vehicle location 122 (e.g., location associated with the vehicle 102 when determining the action(s) 120 to take). In some examples, the two or more actions 120 may be determined based on the initial vehicle location 122 with respect to a first zone 128(1), a second zone 128(2), or a third zone 128(3). In such examples, the action(s) 120 may be determined based on a current location of the vehicle 102 when determining the action to take. The first zone 128(1) may represent an area associated with vehicle travel prior to the collision zone 124. The extent of the first zone 128(1) may be based on speed of the vehicle (e.g., the vehicle trajectory 112). In some examples, the first zone 128(1) may extend to point at which the vehicle 102, traveling at the speed, may not be able to stop prior to the collision zone 124. In various examples, based at least in part on the vehicle 102 being capable of stopping prior to the collision zone 124, the vehicle computing system may determine one or more actions 120 with first acceleration bounds and/or according to first speed profiles. For example, based on a determination that the initial vehicle location 122 is in the first zone 128(1), the vehicle computing system may determine a first action 120(1) to yield prior to the junction 116, a second action 120(2) to proceed according to a first acceleration and/or speed profile, and a third action (not illustrated) to proceed according to a second acceleration and/or speed profile, the first and the second acceleration and/or speed profiles being associated with the first acceleration bounds.

In various examples, the second zone 128(2) may encompass an area associated with the vehicle corridor 106 from the point at which the vehicle 102 cannot stop prior to the collision zone 124 to the collision zone exit point 126. In such examples, the second zone 128(2) may represent the area in which the vehicle 102 is committed to traveling in and through the collision zone 124. In various examples, the second zone 128(2) may have associated therewith second acceleration bounds and/or second speed profiles. In some examples, based on a determination that an initial vehicle location 122 is associated with the second zone 128(2), the vehicle computing system may determine one or more actions with the second acceleration bounds and/or according to the second speed profiles. In at least one example, the second acceleration bounds and/or second speed profiles may include accelerations and/or speeds that are more aggressive (e.g., faster) than the first acceleration bounds and/or the first speed profiles.

In various examples, the third zone 128(3) may encompass an area associated with the vehicle corridor 106 that is after the collision zone 124 (e.g., after the collision zone exit point 126). In various examples, based on a determination that the vehicle 102 is associated with (e.g., located in) the third zone 128(3), the vehicle computing system may determine control the vehicle 102 according to non junction related vehicle control planning considerations. In such examples, the vehicle computing system may determine an action to take to safely proceed through the environment beyond the junction 116.

As discussed herein, the vehicle computing system may determine two or more actions 120 for the vehicle to take based on a determination that the initial vehicle location 122 is associated with the first zone 128(1) or the second zone 128(2). The action(s) 120 (e.g., reference actions and sub-actions) may include actions for the vehicle to take in situations in which the vehicle does not have the right of way (e.g., an object 104 has the right of way). In such examples, the vehicle computing system may be configured to determine a means by which the vehicle 102 may safely make forward progress at an earlier time than would be possible using traditional control planning techniques, such as using a most conservative approach. For example, the vehicle computing system may identify an action 120, such as the second action 120(2) in which the vehicle 102 may safely transit through the junction 116 in front of the first object 104(1) without negatively effecting the first objects 104(1) such as by requiring the first object 104(1) to slow down to avoid a collision with the vehicle 102. As such, the vehicle 102 may be configured to progress toward a destination safely and faster than would otherwise be possible with a most conservative approach, which would have required the vehicle to stop and/or slow forward movement to yield to the first object 104(1).

In various examples, the vehicle computing system may be configured to determine actions 120 that are applicable to the vehicle 102 in the environment 100. For example, an acceleration profile associated with the second action 120(2) may be limited based on a maximum lateral acceleration of the vehicle in a left-hand turn. For another example, accelerating may not be an applicable sub-action for a vehicle operating at a speed limit. For another example, a first acceleration profile associated with the second action 120(2) determined when the vehicle 102 is located in the second zone 128(2) may be more aggressive than a second acceleration profile associated with the second action 120(2) determined when the vehicle is located in the first zone 128(1).

In various examples, the vehicle computing system may determine actions 120 that are applicable to the vehicle 102 based on a detection of an occluded region (e.g., occlusion zone) associated with a junction 116. The occlusion zone may include a region in which a view of at least a portion of the environment (which may include oncoming traffic) may be blocked, such as by an obstacle. Based on the blocked view, the vehicle computing system may not be able to detect objects 104 located in the occlusion zone. In various examples, the vehicle computing system may be configured to identify relevant sections of road associated with an occlusion zone. In some examples, the occlusion zone may be determined based on map data associated with the environment 100 and including data corresponding to one or more sections of road associated with the vehicle path.

In various examples, the vehicle computing system may determine at least two actions 120 associated with an occlusion zone. A first action may include progressing forward at a speed slow enough for the vehicle 102 to stop prior to a collision zone 124 between the vehicle corridor 106 and a potential object 104 located in the occlusion zone. A second action may include progressing through the collision zone 124 at a speed in which the vehicle 102 could clear the collision zone 124 prior to the potential object located in the occlusion zone entering the collision zone. A third action may include progressing thorough the collision zone 124 and/or intersection according to a different acceleration and/or speed profile, and so on.

In various examples, the vehicle computing system may be configured to determine a pre-defined number of actions 120 (e.g., 2, 4, 6, 7, etc.) for the vehicle 102 to perform in the environment 100. In some examples, the pre-defined number of actions 120 may be based in part on a distance of the initial vehicle location 122 to the collision zone 124. For example, the vehicle computing system may consider a first number of actions 120 when the vehicle 102 is at a first distance from the collision zone 124 and a second number of actions 120 when the vehicle 102 is at a second distance from the collision zone 124. In various examples, the pre-defined number of actions 120 may be determined based on whether the vehicle 102 is located in the first zone 128(1) or the second zone 128(2). For example, the vehicle computing system may consider a first number of actions 120 (e.g., 6, 7, etc.) when the vehicle 102 is located in the first zone 128(1) and a second number of actions 120 (e.g., 2, 3, etc.) when the vehicle 102 is located in the second zone.

In various examples, the pre-defined number of actions 120 may be associated with a particular scenario (e.g., type of junction, number of objects detected, etc.). In the illustrative example, the vehicle computing system determines two (2) actions for the vehicle to take at a T-junction 116 with crossing/merging traffic. In such an example, the first action 120(1) includes yielding to the first object 104(1) and the second action includes proceeding ahead of the first object 104(1) according to the vehicle trajectory (e.g., at a particular speed and/or acceleration profile). In another example, the vehicle computing system may determine four (4) actions associated with the T-junction 116, a first action 120 including a yield and three actions 120 including proceeding ahead of the first object according to different acceleration profiles. For yet another example, the vehicle computing system may determine six (6) actions for the vehicle 102 to take at a perpendicular four-way junction with crossing traffic, in which the vehicle path continues straight through the junction. Though these are merely illustrative examples and are not intended to be so limiting.

The vehicle computing system may generate a simulation for each action 120 the vehicle could take based on the scenario (e.g., based on the objects 104, the junction 116, etc.). The simulation may include a simplistic representation of the vehicle 102 and one or more objects 104 traveling through the environment 100 for a future period of time (e.g., 4 seconds, 8 seconds, etc.). In some examples, the simulation may include the simplistic representation of the vehicle 102 traveling through the environment 100 to a particular location and/or distance from the junction 116 (e.g., clear of the junction 116, 10 meters beyond the junction, etc.). In various examples, the simulation may include a simulated vehicle proceeding according to the action 120 and simulated objects corresponding to one or more of the detected objects 104. In some examples, the simulated objects may include simulations of objects 104 that are located within a threshold distance of the vehicle 102 and/or the junction 116. In some examples, the simulated objects may include simulations of the detected objects 104 that are relevant to the progress of the vehicle 102. In some examples, the vehicle computing system may determine that the objects 104 are relevant to the progress of the vehicle 102 based on a determination that an object trajectory 108 associated therewith crosses and/or comes within a threshold distance of the path (e.g., corridor 106) of the vehicle 102. As an illustrative example, the simulation may include a first simulated object representative of the first object 104(1) and a second simulated object representative of the second object 104(2).

In various examples, the vehicle computing system may cause each simulated object in the simulation to travel through the simulation based on associated predicted object trajectories 108 (e.g., determined based on the associated object 104). In some examples, the vehicle computing system may cause each simulated object to travel through the simulation based on one or more acceleration profiles. In some examples, the acceleration profile(s) may be based on a predicted object reaction to the vehicle 102 performing the action 120.

In various examples, the acceleration profile(s) may include a minimum acceleration profile associated with an object reaction to the vehicle action 120. The minimum acceleration profile may include a minimum deceleration or acceleration associated with the object 104 based on the action 120. In various examples, the acceleration profile(s) may include a maximum acceleration profile associated with the object reaction. The maximum acceleration profile may include a maximum predicted deceleration or acceleration associated with the object 104 based on the action 120.

In various examples, the vehicle computing system may determine a cost associated with each simulation (e.g., each action 120) based on the object trajectories 108 and/or the acceleration profile(s). The cost may include a safety cost, a comfort cost, a progress cost, and/or an operational rules cost. In some examples, the cost associated with an action 120 may include a combination of two or more of the safety cost, the comfort cost, the progress cost, and the operational rules cost. In at least one example, the cost associated with an action 120 and/or a simulation may be determined utilizing machine learning techniques. In such an example, one or more machine learned models may be trained to determine one or more costs associated with each action based on training data.

In some examples, one or more of the costs may be determined based on predicted future vehicle actions performed in response to an object 104 in the environment 100, such as second object 104(2). For example, the vehicle computing system may run the simulation with the second action 120(2) in which the vehicle 102 proceeds ahead of the first object 104(1). The vehicle computing system may determine in the simulation to modify the vehicle trajectory 112 at a time in the future to yield to the second object 104(2) based on the second object trajectory 108(2). The vehicle computing system may determine a second action simulated vehicle location 130 at a future time (e.g., time (T)) associated with the yield to the second object 104(2) (e.g., jaywalker) and may determine the costs associated with the second action 120(2) based on the predicted future vehicle action and/or the second action simulated vehicle location 130.

In various examples, the vehicle computing system may determine the safety cost based on one or more predicted distances between the vehicle 102 and the objects 104 in the simulation (e.g., between the simulated vehicle and the simulated objects). The predicted distances may represent distances between the vehicle 102 and the objects 104 at one or more future times. In at least one example, the distances may be determined based on the predicted trajectory 108 associated with each object 104 and/or the acceleration profiles. In some examples, the vehicle computing system may be configured to generate a heat map or other graphical representation (referred to herein as a "heat map") depicting the distances and/or probability that the vehicle 102 and the object 104 will be at the locations associated with the distances at respective future times. In some examples, the safety cost may be determined based on the heat map associated with the collision zone 124. In such examples, the safety cost may represent a likelihood of collision between the vehicle 102 and the crossing and/or merging object 104, such as object 104(1).

In some examples, the heat map may be determined based on a modified vehicle trajectory 112, modified in response to a second object 104(2), such as the jaywalker example described above. For example, the vehicle computing system may determine a simulated object location 132 the future time (T) associated with the vehicle yielding to the second object 104(2). The vehicle computing system may determine the heat map based at least in part on the simulated object location 132 and the object trajectory 108, the heat map representative of a likelihood of collision between the vehicle 102 and the first object 104(1).

In various examples, the vehicle computing system may determine that the safety cost associated with an action 120 meets or exceeds a threshold safety cost. In such examples, the vehicle computing system may determine to terminate the simulation associated the particular vehicle action 120. In some examples, the threshold safety cost may be associated with a threshold probability (e.g., likelihood) of collision between the vehicle 102 and the first object 104(1). Based on a determination that the safety cost meets or exceeds the threshold safety cost, the vehicle computing system may withdraw (e.g., remove) the action 120 from vehicle planning considerations.

In various examples, the vehicle computing system may determine the comfort cost based on an estimated acceleration (e.g., positive, negative, lateral, etc.) associated with the object 104 and/or vehicle 102 caused by the vehicle action 120. In some examples, the cost may be based on the value associated with the acceleration. For example, a 2 foot per second acceleration (e.g., 2 feet per second) may result in a comfort cost of 2. Of course, examples of acceleration values and/or costs are not intended to be limiting, and other values and/or costs are contemplated herein. In some examples, the comfort cost may be based on an estimated closest distance between the vehicle and the first object 104(1) at a particular time in the simulation. For example, an action in which the vehicle 102 and the first object 104(1) are projected to be a first distance from one another at a closest point of approach may have associated therewith a first comfort cost and another action 120 in which the vehicle 102 and the first object 104(1) are projected to be a second distance from one another at the closest point of approach may have associated therewith a second comfort cost that is different from the first comfort cost.

In some examples, the vehicle computing system may determine the comfort cost based on potential discomfort to a passenger based on a positional variation in a lane (e.g., moving to a right side of the lane, moving to a left side of the lane) associated with an action 120. For example, a reference action may include adjusting a position in a lane to a left side of the lane. The positional variation may result in the vehicle 102 progressing close to, but not crossing, a lane barrier. Traveling close the lane barrier may be uncomfortable for a passenger of the vehicle 102, and thus may incur a comfort cost.

In various examples, the vehicle computing system may determine the progress cost based on a change in velocity of the vehicle 102 and/or the object 104 (e.g., to slow down, stop, etc.) and/or a delay of vehicle 102 movement from a yielding position, such as to avoid a collision (e.g., waiting at a stop sign, yielding prior to a junction, etc.). In various examples, the progress cost may include a value substantially similar to the delay attributed to the estimated state. For example, the first action 120(1) may include the vehicle 102 waiting at the junction 116 for seven (7) seconds (e.g., at first action simulated vehicle location 134) while the first object 104(1) approaches and passes through the collision zone 124 associated with the junction 116. The progress cost associated with the first action 120(1) may include a value of seven (7), although other values are contemplated herein.

In various examples, the progress cost may include a delay of object 104 movement caused by a vehicle action 120. Continuing the example from above, the vehicle performing the second action 120(2) proceeding ahead of the first object 104(1) in the junction 116 may yield to the second object 104(2) jaywalking across a road. The vehicle computing system may modify the vehicle trajectory 112 to yield to the second object 104(2), thereby causing the first object 104(1) to slow behind the vehicle 102. The vehicle computing system may determine a delay to the movement of the first object 104(1) caused by the vehicle yielding to the second object 104(2) and may include the delay in the progress cost.

In various examples the vehicle computing system may determine an operational rules cost based on rules of the road (e.g., department of transportation laws, codes, regulations, etc.), rules of good driving, regional driving habits (e.g., common driving practices), driving courtesies (e.g., adjusting a position in a lane to provide space for another car to pass for a right-hand turn, not occupying a bike lane, etc.). In various examples, the operational rules cost associated with an action 120 (e.g., a simulation) may be calculated based on one or more rules that are broken and/or satisfied. In such examples, the operational rules cost may be increased based on rules (e.g., rules, habits, courtesies, etc.) that are broken or unfulfilled and/or decreased based on rules that are satisfied or fulfilled. For example, the second action 120(2) may include the vehicle 102 proceeding ahead of the first object 104(1) at a junction 116 in which the first object 104(1) has a right of way. Based at least in part on the right of way, the second action 120(2) may have associated therewith an operational rules cost of 1, whereas a first action 120(1) in which the vehicle 102 yields to the first object 104(1) may have associated therewith an operational rules cost of 0. Though this is merely an illustrative example and other values are contemplated herein.

Additionally or in the alternative, and as will be described in detail below with respect to FIG. 4, the vehicle computing system may determine an occlusion cost associated with an occluded region in the environment 100. In various examples, the vehicle computing system may be configured to identify an occlusion zone (e.g., also referred to as an occluded region) in which a view of at least a portion of the environment 100 (which may include oncoming traffic) may be blocked, such as by an obstacle. The occlusion zone may define a region in which the vehicle computing system may not be able to detect objects 104. In various examples, the vehicle computing system may be configured to identify the relevant section of road associated with the occlusion zone. In such examples, the section of road may include one or more lanes, sidewalks, bike lanes, etc. configured for objects 104 to operate in a direction that may be relevant to the vehicle 102. For example, the occlusion zone may include two lanes of a road in which objects may travel toward the vehicle. In such an example, any additional lanes of the road in which objects travel in a direction away from the vehicle 102 may be not included in the occlusion zone.

In various examples, the vehicle computing system may generate the simulation associated with each action 120 with an occluded object located in the occlusion zone. In such examples, the occluded object may not be generated based on sensor data, but instead may include a potential object that may or may not be located in the occlusion zone. In some examples, the occluded object may be generated at a location within the occlusion zone that is a closest location to the vehicle 102 and/or the junction 116. In some examples, the vehicle computing system may determine one or more predicted object trajectories associated with the occluded object based on a speed limit of the road, stored data associated with previously detected objects in the occlusion zone, acceleration profiles, or the like. In such examples, the vehicle computing system may determine predicted future locations of the occluded object based on the predicted object trajectories.

In various examples, the vehicle computing system may determine the occlusion cost based on a speed of the vehicle (e.g., independent of a predicted object trajectory). In some examples, the occlusion cost may include a progression penalty. The progression penalty may represent a cost associated with progressing through a junction 116 associated with the occlusion zone based on the speed. In some examples, the progression penalty may be higher for faster speeds, to ensure safe operation of the vehicle. In some examples, the progression penalty may be determined by multiplying a squared vehicle speed by the time associated with the vehicle being within a collision zone 124 between the vehicle 102 and the occluded object.

In some examples, the occlusion cost may include a blocking penalty associated with the vehicle 102 occupying space in front of the occlusion zone for a period of time. In some examples, the vehicle computing system may determine the blocking penalty by multiplying the vehicle speed by the time associated with the vehicle 102 being within the collision zone 124. In various examples, the occlusion cost may include a sum of the progression penalty and the blocking penalty. In some examples, the occlusion cost may include the sum of the progression penalty and the blocking penalty multiplied by a probability that the action 120 will affect a progress of the occluded object traveling through the environment 100. In some examples, the probability may be determined based on a distance between the occluded object (e.g., the occlusion zone) and the collision zone 124. In some examples, the probability may additionally be determined based on a predicted object trajectory of the occluded object. In various examples, the probability may be based in part on a time associated with the occluded object traveling from the occlusion zone to the collision zone.

In various examples, the vehicle computing system may determine that one or more of the safety cost, the comfort cost, the progress cost, the operational rules cost, or the occlusion cost associated with a simulation exceeds a threshold cost. In some examples, the vehicle computing system may determine that a total cost associated with an action (e.g., a simulation) exceeds a threshold total cost. In some examples, based on a determination that a cost (e.g., individual cost and/or total cost) exceeds the respective threshold cost, the vehicle computing system may determine to terminate the simulation prior to completion and may remove the associated action 120 from vehicle control planning considerations. In various examples, terminating the simulation prior to the completion thereof may increase processing power available for the vehicle computing system to perform other calculations, such as running alternative simulations associated with different actions. In such examples, the techniques described herein may improve the performance of the vehicle computing system.

In various examples, the vehicle computing system may determine a total cost associated with each action 120 based on one or more of the safety cost, the comfort cost, the progress cost, the operational rules cost, and the occlusion cost. In some examples, the vehicle computing system may compare the total costs of each action and may select the action 120 associated with the optimal cost. The optimal cost may include a lowest cost or a highest cost, based on scoring parameters (e.g., highest being best, lowest being best, etc.). The vehicle computing system may determine to perform the action 120 associated with the optimal cost and may control the vehicle 102 through the environment according to the action.

Figure 2:
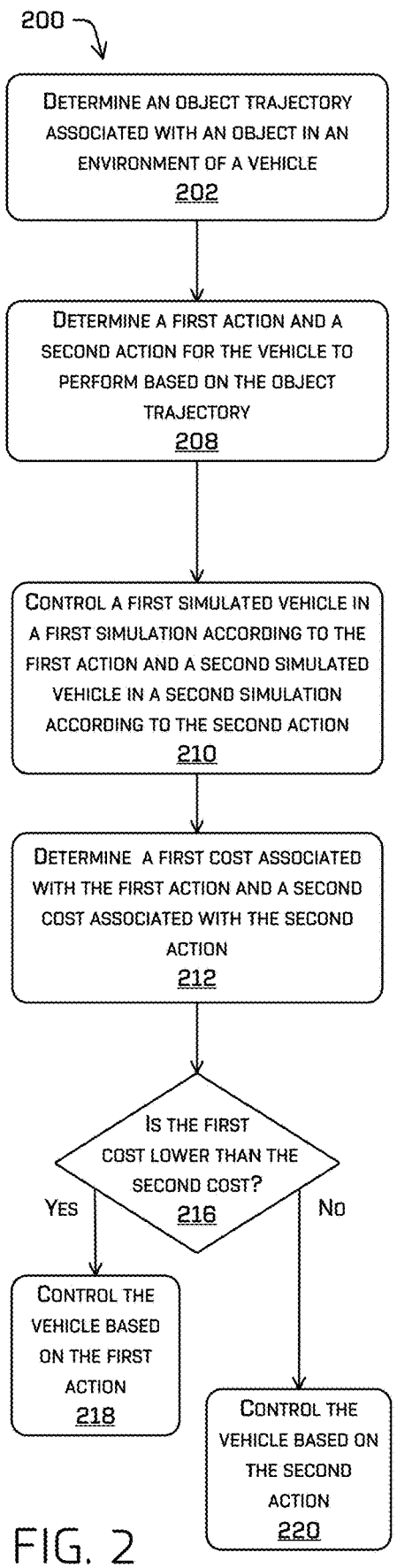
FIG. 2 depicts an example process for determining an action for a vehicle to perform in an environment based at least in part on a cost associated with the action, in accordance with examples of the disclosure.
Figure 2:
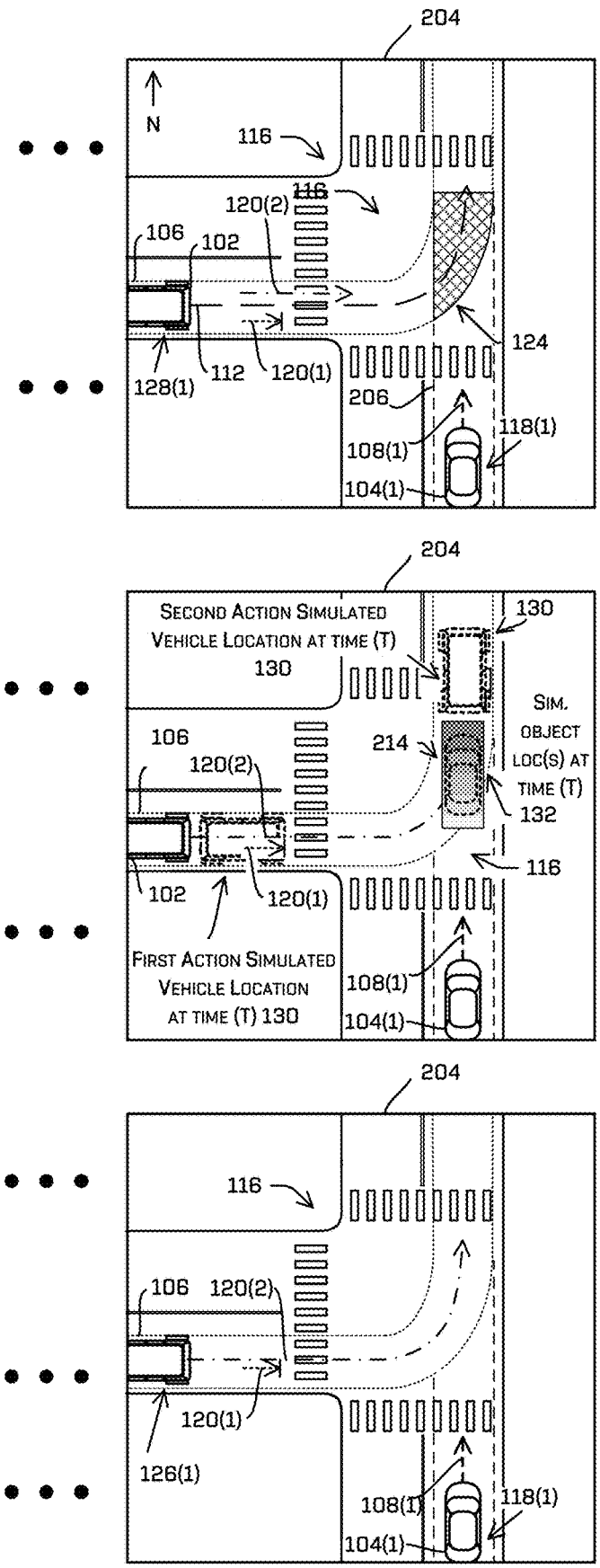

FIG. 2 depicts an example process 200 for determining an action for a vehicle 102 to perform in an environment 204 based at least in part on a cost associated with the action.

At operation 202, the vehicle computing system determines an object trajectory 108(1) associated with the object 104(1). In various examples, the vehicle computing system may determine the object trajectory 108(1) (e.g., predicted path in which the object 104(1) may travel through the environment 204) based on sensor data from one or more sensors (e.g., lidar, radar, cameras, motion detectors, etc.).

The sensors may include sensors mounted on the vehicle 102, another vehicle, and/or sensors mounted in the environment 204, such as sensors 114.

In some examples, the vehicle computing system may determine an object corridor 206 based in part on the object trajectory 108(1) and/or a current object location 118(1) (e.g., first object location 118(1)). In some examples, the vehicle computing system may be configured to determine the first object location 118(1) based at least in part on the sensor data. In various examples, the object corridor 206 may represent an area over which the object 104(1) may travel in the environment 204, such as based on the object trajectory 108(1). For example, the object corridor 206 represents the object 104 approaching the junction 116 and continuing straight through the junction 116.

In some examples, the area may be defined by a width of the object 104(1) and/or a buffer region (e.g., 1 foot, 1 meter, etc.) on either side of the object 104(1) and a distance in front of and/or behind the object 104. In various examples, the area may be determined based on an object type associated with the object 104(1). In such examples, the vehicle computing system may be configured to determine the object type associated with the object 104(1), such as based on sensor data.

In various examples, the vehicle computing system may determine a potential collision zone 124 (collision zone 124) between the vehicle 102 and the object 104(1) based on a vehicle corridor 106 (e.g., planned path of the vehicle 102 based in part on a vehicle trajectory 112), the object trajectory 108(1), and/or the object corridor 206. The collision zone 124 may represent an area of overlap between the vehicle corridor 106 and the object trajectory 108(1) and/or the object corridor 206.

At operation 208, the vehicle computing system determines a first action 120(1) and a second action 120(2) of the vehicle to perform based on the object trajectory 108(1). In the illustrative example, the first action 120(1) may include a determination to yield and the second action 120(2) may include a determination to proceed into the junction 116 ahead of the object 104(1). In some examples, the first action 120(1) may include a determination to proceed according to a first acceleration and/or speed profile and the second action 120(2) may include a determination to proceed according to a second acceleration and/or speed profile. Though described as two actions, the first action 120(1) and the second action 120(2), the is merely for illustrative purposes, and any number of actions may be considered by the vehicle computing system.

In some examples, the vehicle computing system determines to perform at least one of the first action 120(1) or the second action 120(2) based on the current object location 118(1) associated with the object 104(1). As discussed above, based on a determination that the current object location 118(1) is less than a first threshold distance from the junction 116 and/or the vehicle 102, the vehicle computing system determines to yield to the object 104(1). In various examples, the first threshold distance may represent a proximity of the object 104(1) to the junction 116 such that the vehicle 102 does not have sufficient time to proceed through the junction without a high probability of collision (e.g., 75%, 80%, etc.).

In some examples, based on a determination that the current object location 118(1) is greater than a second threshold distance from the junction 116 and/or the vehicle 102, the vehicle computing system determines to proceed through the junction 116 ahead of the object 104(1). In such examples, the second threshold distance may represent a distance that permits sufficient time for the vehicle 102 to safely perform the action and proceed ahead of the object 104(1). In examples in which the current object location 118(1) is equal to or less than the first threshold distance or equal to or greater than the second threshold distance, the vehicle computing system may control the vehicle according to the determined action (e.g., yield or proceed, respectively). In examples in which the current object location 118(1) is between the first threshold distance and the second threshold distance, the vehicle computing system may proceed with the process 200 to determine the action to perform.

At operation 210, the vehicle computing system controls a first simulated vehicle in a first simulation according to the first action 120(1) and a second simulated vehicle in a second simulation according to the second action 120(2). In various examples, the first simulation and the second simulation may include simulated objects representative of the object 104(1). The simulated objects may traverse through a simulated environment that represents environment 204 based in part on the object trajectory 108(1).

In some examples, the vehicle computing system may cause the simulated objects to travel according to one or more acceleration profiles. In some examples, the acceleration profiles may represent a maximum acceleration and a minimum acceleration predicted for the object 104(1) to follow. In some examples, the maximum acceleration and the minimum acceleration may be determined based on the vehicle action (e.g., first action 120(1) or the second action 120(2)). For example, the first action 120(1) may include the vehicle yielding to the object 104(1). The vehicle computing system may determine a minimum and maximum accelerations predicted for the object 104(1) to travel through the environment 204 (e.g., the junction 116). The second action 120(2) may include the vehicle 102 proceeding through the junction 116 ahead of the object 104(1). The vehicle computing system may determine a minimum and maximum acceleration (e.g., negative accelerations) predicted for the object 104(1) to travel through the environment 204, such as based on the vehicle 102 proceeding ahead of the object 104(1). In various examples, the minimum and/or maximum accelerations associated with an action may represent a prediction of an object reaction to the vehicle 102 performing the action.

In some examples, the vehicle computing system may run the simulation and determine one or more simulated object locations 132 associated with the object 104(1) at various time intervals based on the acceleration profiles. The simulated object locations 132 may represent an area in which at least a portion of the object 104(1) may potentially be located at a particular time in the future, based on the object trajectory 108(1) and/or the acceleration profiles. For example, the simulated object location 132 may represent an area corresponding to potential locations of the object 104(1) at a time (T) based on the object trajectory 108(1) and a maximum and minimum acceleration. Though illustrated as a single simulated object location 132 (e.g., single area), it is understood that the acceleration profiles associated with the object 104(1) are determined based on a vehicle action and thus, a first simulated object location 132 associated with a first simulation may be different in size and/or shape from a second simulated object location 132 associated with a second simulation. By utilizing the acceleration profiles, the vehicle computing system may determine future locations of the object 104(1) with a high degree of probability. As such, the vehicle computing system may ensure the safe operation of the vehicle with respect to the object 104(1).

At operation 212, the vehicle computing system determines a first cost associated with the first action 120(1) and a second cost associated with the second action 120(2). In various examples, the first cost and/or the second cost may include a safety cost, a comfort cost, a progress cost, an operational rules cost, and/or an occlusion cost, as described above. In at least one example, the first cost and the second cost include a safety cost. In some examples, the safety cost may be determined based in part on a heat map 214 associated with one or more predicted distances between the vehicle 102 and the object 104(1). In such examples, the vehicle computing system generates the heat map 214 associated with simulation. In some examples, the heat map 214 may represent a graphical illustration of the predicted distance(s) and/or probabilities associated therewith. In some examples, the heat map 214 may include a list of predicted distances and probabilities associated therewith. In various examples, the safety cost may be determined based at least in part on the predicted distance(s) and the probabilities associated therewith. For example, a first action that includes a first probability that the vehicle 102 and the object 104(1) will be a first distance from one another may include a first safety cost and a second action that includes a second probability that the vehicle 102 and the object 104(1) will be a second distance from one another may include a second safety cost.

As discussed above, the comfort cost may include a cost associated with at least one of an acceleration and/or speed profile of the vehicle 102 associated with a respective action. In some examples, the comfort cost may be determined based on a position in a lane, such as based on a perceived comfort or discomfort by a passenger of the vehicle 102. In some examples, the vehicle computing system may be configured to determine whether a passenger is present in the vehicle 102 and may apply the comfort cost based on a determination that the passenger is riding in the vehicle 102.

The progress cost may be associated with a progress of the vehicle 102 toward a destination. In some examples, the progress cost may be determined based on a delay caused by an action. For example, a first action 120(1) may include the vehicle yielding to the object 104(1). The yield may cause a four (4) second delay in travel to the environment and the progress cost may be determined based on the four (4) second delay.

As discussed above, the operational rules cost may be based on rules of the road (e.g., department of transportation laws, codes, regulations, etc.), rules of good driving, regional driving habits (e.g., common driving practices), driving courtesies (e.g., adjusting a position in a lane to provide space for another car to pass for a right-hand turn, not occupying a bike lane, etc.). In various examples, the operational rules cost associated with an action (e.g., a simulation) may be calculated based on one or more rules that are broken and/or satisfied. In such examples, the operational rules cost may be increased based on rules (e.g., rules, habits, courtesies, etc.) that are broken or unfulfilled and/or decreased based on rules that are satisfied or fulfilled. In some examples, the operational rules cost associated with the action may be calculated based on an exceedance of a rule. For example, a first operational rules cost may be associated with exceeding a speed limit by a first amount (e.g., one kilometer per hour, etc.) and a second, higher, operational rules cost may be associated with exceeding the speed limit by a second amount (e.g., two kilometers per hour, etc.).

As discussed above, the vehicle computing system may be configured to determine an occluded region associated with an environment 204. The occluded region may include a region in which the vehicle computing system is unable to detect objects. In some examples, the vehicle computing system may determine the first action 120(1) and the second action 120(2) based on the occluded region and may determine costs associated with each action based on a simulated occluded object, vehicle speed associated with the actions, a predicted object trajectory associated with the simulated occluded object, a time associated with the vehicle traversing the collision zone 124 associated with the occluded area, a type of junction 116, and the like. In at least one example, the vehicle computing system determines the action to perform based on the occlusion cost.

In some examples, the first cost and the second cost may include a total cost associated with an action. In some examples, the first cost and the second cost may include one or more of the safety cost, the progress cost, the comfort cost, the operational rules cost, and the occlusion cost associated with respective actions.

At operation 216, the vehicle computing system determines whether the first cost is lower than the second cost. In the illustrative example, an optimal action may be associated with a lowest cost action. In other examples, the optimal action may be associated with a highest cost action. In such examples, the vehicle computing system may determine whether the first cost is higher than the second cost.

Based on a determination that the first cost is lower than the second cost ("Yes" at operation 216), the vehicle computing system, at operation 218, controls the vehicle based on the first action. Based on a determination that the first cost is higher than the second cost ("No" at operation 216), the vehicle computing system, at operation 220, controls the vehicle based on the second action. As will be discussed in detail with regard to FIG. 5, the vehicle computing system may control the vehicle utilizing one or more drive systems and/or other components associated with the vehicle computing system.

FIG. 3 is a collection of illustrations 300 of potential actions (also referred to as candidate actions) 304, 306, and 308, for a vehicle 302, such as vehicle 102 to take in an environment, such as environment 100, and respective costs 310, 312, 314, associated therewith. Though illustrated as three actions, a first action 304, which may correspond to action 120(2) with a first acceleration, a second action 306, which may correspond to action 120(2) with a second acceleration, a third action 308, which may correspond to action 120(1), a greater or lesser number of actions may be considered by the vehicle computing system.

In some examples, the actions 304, 306, and/or 308 may be determined based on a vehicle location 316 with respect to one or more zones, such as a first zone 318(1), a second zone 318(2), or a third zone 318(3), such as the first zone 128(1), the second zone 128(2), and the third zone 128(3), respectively. In such examples, the actions 304, 306, and/or 308 may be determined based in part on a current location associated with the vehicle when determining the action to take. The first zone 318(1) may represent an area associated with vehicle travel prior to a collision zone 320. The collision zone 320 may be defined by an overlap of a planned path of the vehicle 302 and a predicted path of a crossing and/or merging object 322 (e.g., object 322). In at least one example, the overlap may include an overlap of a vehicle corridor, such as vehicle corridor 106, with an object corridor, such as object corridor 206.

In various examples, an extent (e.g., length) of the first zone 318(1) may be determined based on a speed of the vehicle. In some examples, the first zone 318(1) may extend to a point at which the vehicle 302, traveling at the speed, may not be able to stop prior to the collision zone 320. In various examples, based at least in part on the vehicle 302 being capable of stopping prior to the collision zone 320, the vehicle computing system may determine one or more actions 304, 306, and 308 with first acceleration bounds and/or according to first speed profiles. For example, based on a determination that the initial vehicle location 316 is in the first zone 318(1), the vehicle computing system may determine a first action 304 to proceed according to a first acceleration profile, and a second action 306 to proceed according to a second acceleration profile, the first and the second acceleration and/or speed profiles being associated with the first acceleration bounds. The vehicle computing system may additionally determine the third action 308 to yield prior to a junction 324 based on the vehicle location 316 being prior to the junction 324.

In various examples, the second zone 318(2) may encompass an area defined by a width determined based on the vehicle corridor and a length including a first length 326 defined by the point at which the vehicle 302 cannot stop prior to an entry boundary of the collision zone 320 and a second length 328 defined by the collision zone 320 itself (e.g., from the entry boundary to an exit boundary). In at least one example, the first length 326 is determined based on a speed associated with the vehicle trajectory. In some examples, the second length 328 is determined based on an object corridor. In some examples, the object corridor may include a width of the object plus a safety buffer. In some examples, the object corridor may be determined based on a type of object associated with the object 322. For example, an object corridor associated with a pedestrian may include a second length 328 of 3 feet, whereas an object corridor associated with another vehicle may include a second length of 3 meters, though these lengths are merely provided for illustrative purposes and are not intended to be so limiting.

In various examples, the second zone 318(2) may represent the area in which the vehicle 302 is committed to traveling in and through the collision zone 320. In various examples, the second zone 318(2) may have associated therewith second acceleration bounds and/or second speed profiles. In some examples, based on a determination that a current vehicle location 316 is associated with the second zone 318(2), the vehicle computing system may determine one or more actions with the second acceleration bounds and/or according to the second speed profiles. In at least one example, the second acceleration bounds and/or second speed profiles may include accelerations and/or speeds that are more aggressive (e.g., faster) than the first acceleration bounds and/or the first speed profiles.

In various examples, the third zone 318(3) may encompass an area associated with the vehicle corridor that is after the collision zone 320 (e.g., after the exit boundary). In various examples, based on a determination that the vehicle 302 is associated with (e.g., located in) the third zone 318(3), the vehicle computing system may determine control the vehicle 302 according to non-junction related vehicle control planning considerations. In such examples, the vehicle computing system may determine an action to take to safely proceed through the environment beyond the junction 324.

As discussed herein, the vehicle computing system may determine two or more actions 304, 306, 308, and the like, for the vehicle 302 to take based on a determination that the current vehicle location 316 is associated with the first zone 318(1) or the second zone 318(2). In some examples, the actions 304, 306, and 308 may be pre-defined and/or stored in a memory of a vehicle computing device, such as that accessible by a planning component (e.g., planning component 524 of FIG. 5). For example, the planning component may store the actions 304, 306, and/or 308 as a pre-defined set of actions the vehicle 302 may take at a two-way stop (e.g., where crossing traffic has the right of way). In some examples the actions 304, 306, and/or 308 may be determined by the planning component based on the environment, such as based on a number and/or proximity of objects 322 detected in the environment, such as objects 104 of FIG. 1. In various examples, the vehicle computing system may determine if an action is applicable to the vehicle 302 in the environment at a particular time (e.g., from an initial position). In such examples, the vehicle computing system may access pre-determined actions and determine whether each of the pre-determined actions are applicable to the environment 100. An action may be applicable to an environment based on a determination that it is capable of being performed in the environment (e.g., accelerate from a stop sign), not capable of being performed in the environment (e.g., lane change while vehicle is operating on a single-lane road, etc.), logical to the environment (e.g., accelerating slowly in an occlusion zone, etc.), not logical to the environment (e.g., accelerating rapidly in proximity to a playground, etc.), or the like.

As discussed above, the actions 304, 306, and/or 308 may include reference actions and/or sub-actions. Reference actions may include staying in a lane, going around an obstacle, aborting an obstacle go-around, making a lane change, or the like. Sub-actions may include maintaining a velocity, accelerating, decelerating, adjusting a position in a lane, or the like. In the illustrative example, action 304 includes staying in a lane (reference action) and accelerating at a first acceleration (sub-action), and action 306 includes staying in a lane (reference action) and accelerating at a second acceleration (sub-action). Additionally, in the illustrative example, action 308 includes staying a lane (reference action) and decelerating to yield to the object 322 (sub-action).

In various examples, for each of the actions 304, 306, and/or 308, the vehicle computing system may determine one or more predicted object trajectories, such as trajectories 108 based on the respective action(s) 304, 306, 308. In some examples, the predicted object trajectories may be based in part on sensor data collected by one or more sensors of the vehicle and/or sensors in the environment (e.g., mounted on another vehicle, fixed in place such as at a blind intersection, etc.). In some examples, the predicted object trajectories may be based in part on a classification associated with the objects 322 (e.g., a type of object). For example, a first predicted object trajectory associated with the object 322 classified as a car may include a first deceleration corresponding to first amount of pressure applied to the brakes in response to a vehicle 302 traveling through an intersection in front of the object 322. A second predicted object trajectory associated with the object 322 classified as a semi-trailer truck may include a second deceleration corresponding to a second amount of pressure applied to the brakes (e.g., more pressure to stop a larger vehicle) in response to the vehicle 302 crossing in front of the object 322.

In various examples, the predicted object trajectories may be determined based on one or more acceleration profiles 330. In some examples, the acceleration profile(s) 330 associated with a particular action may be determined based in part on the reference action associated therewith. For example, the first action 304 includes a reference action to stay in a lane and proceed ahead of the object 322. In such an example, the vehicle computing system may identify a first acceleration profile 330(1) to apply. For another example, the third action 308 includes staying in a lane and yielding to the object 322. Based in part on the yield, the vehicle computing system may identify a second acceleration profile 330(2) to apply.

As discussed above, the acceleration profile(s) 330 may include minimum and maximum accelerations predicted for the object 322 based on the respective vehicle action 304, 306, 308. The minimum acceleration may include a minimum change to the object trajectory predicted by the vehicle computing system. For example, the acceleration profile 330(1) associated with the first action 304 and the second action 306 includes a first acceleration (e.g., negative acceleration) that represents the minimum acceleration or change to a speed of the object trajectory in response to the vehicle performing at least one of the first action 304 or the second action 306. In the illustrative example, the acceleration profile 330(1) also includes a second acceleration (e.g., negative acceleration) that represents the maximum acceleration or change to a speed of the object trajectory in response to the vehicle performing at least one of the first action 304 or the second action 306. The maximum and minimum accelerations may be used to determine one or more predicted simulated object locations 332 associated with various times in a simulation, such as simulated object locations 132.

As discussed above, for each action 304, 306, and 308, the vehicle computing system may generate and run a simulation, such as to determine one or more future states (e.g., simulated states) of the vehicle and the object 322. A first simulated state associated with a first time ($T_1$) may include a first simulated vehicle location 334(1) and a first simulated object location 332(1), a second simulated state associated with a second time ($T_2$) may include a second simulated vehicle location 334(2) and a second simulated object location 332(2), and a third simulated state associated with a third time ($T_3$) may include a third simulated vehicle location 334(3) and a third simulated object location 332(3), and so on. The estimated object locations 332(1), 332(2), and 332(3) may be determined based on the predicted object trajectory and/or the acceleration profile 330. Though illustrated as three locations 332(1), 332(2), and 332(3) and 334(1), 334(2), and 334(3) associated with the object 322 and the vehicle 302, respectively, such as in a visual representation of three simulated states, a greater or lesser number of simulated states (e.g., positions) may be determined for the object 322 and the vehicle 302, over a period of time associated with the simulation.

In various examples, the vehicle computing system may determine simulated states (and thus simulated object locations 332(1), 322(2), and 322(3) and simulated vehicle locations 334(1), 334(2), and 334(3)) at a pre-determined rate (e.g., 10 hertz, 20 hertz, 50 hertz, etc.) over a period of time (e.g., 4 seconds, 8 seconds, 10 seconds, etc.). In at least one example, the simulated states may be performed at a rate of 10 hertz (e.g., 80 estimated states over an 8 second period of time). In such an example, the estimated locations 332(1), 332(2), and 332(3) and 334(1), 334(2), and 334(3) may be determined at 0.1 second intervals. In some examples, the vehicle computing system may be configured to generate and run simulations associated with each action substantially in parallel, thereby decreasing the time required to determine an action to perform.

As illustrated in FIG. 3, the vehicle computing system may determine a first cost 310 associated with a first action 304, a second cost 312 associated with a second action 306, and a third cost 314 associated with a third action 308. In some examples, the vehicle computing system may determine a cost associated with each simulated state based on the estimated positions of the vehicle 302 and object 322, and/or the object and vehicle trajectories associated with the respective action 304, 306, 308. In such examples, the costs 310, 312, and 314 may represent a summation of the costs associated with each simulated position. For example, the safety cost of 16 associated with the first cost 310 may represent a total cost of each safety cost calculated for respective simulated states. For example, a first simulated state may include a first safety cost of 0 at least because of distances from a first estimated vehicle location 334(1) to the first simulated object location 332(1) associated with the first object 322, a second estimated state may include a second safety cost of 2 as the respective distances between the vehicle 302 and the object 322 gets closer with converging trajectories, and a third estimated state may include a third safety cost of 14 based on the limited distance between at least the third estimated vehicle location 334(3) and the third simulated object location 332(3). In various examples, the enumerated costs (e.g., safety cost, comfort cost, progress cost, operational rules cost, etc.) and/or the costs 310, 312, and 314 may be normalized with respect to one another, such as by applying a gain. In such examples, the respective costs may be comparable to one another in order to be used in a cost-based analysis. For example, the cost 310 includes a safety cost of 16, a comfort cost of 6, a progress cost of 2 and a road rules cost of 1, each of which may be normalized to be added together for a total cost 310 of 25.

As discussed above, the costs 310, 312, and 314 may include a total of the various enumerated costs (e.g., safety cost, comfort cost, progress cost, operational rules cost, etc.). In some examples, the costs 310, 312, and 314 may include a highest cost associated with any of the calculated costs, such as a highest value associated with the safety cost, the comfort cost, the progress cost, the operational rules cost, or the like. Though illustrated as including a safety cost, a comfort cost, a progress cost, and an operational rules cost, this is not intended to be so limiting, and the costs 310, 312, 314 may include additional or alternative costs. For example, the costs 310, 312, 314 may include an occlusion cost. For another example, the costs 310, 312, and 314 may be determined based on a safety cost, a comfort cost, and a progress cost.

In various examples, the vehicle computing system may compare costs 310, 312, and 314 associated with each action 304, 306, and 308, respectively, and may determine the action to perform (e.g., control the vehicle). In some examples, the vehicle computing system may select the action to perform based on a lowest cost associated therewith. In various examples, the vehicle computing system may identify actions 304, 306, and 308 with individual costs (e.g., safety cost, comfort cost, progress cost, etc.) below a threshold level associated with the type of cost and may select the lowest cost action from the identified actions. For example, a threshold safety cost may include a value of 10. Because the first action 304 includes a safety cost above the threshold safety cost, the vehicle computing system may disregard the first action 304 from planning considerations. In some examples, the vehicle computing system may identify the individual cost associated with an action 304, 306, or 308, as being above a threshold value and may terminate a simulation associated with the action 304, 306, or 308. For example, the vehicle computing system may determine, after a third estimated state, that the first action 304 has a safety cost above a threshold value. Based on the determination that the safety cost is above the threshold value, the vehicle computing system may terminate the simulation and/or additional calculations associated therewith. In such examples, the techniques described herein may provide additional computing resources for determining costs associated with other (viable) actions, thereby improving the functioning of the vehicle computing system.

Figure 4:
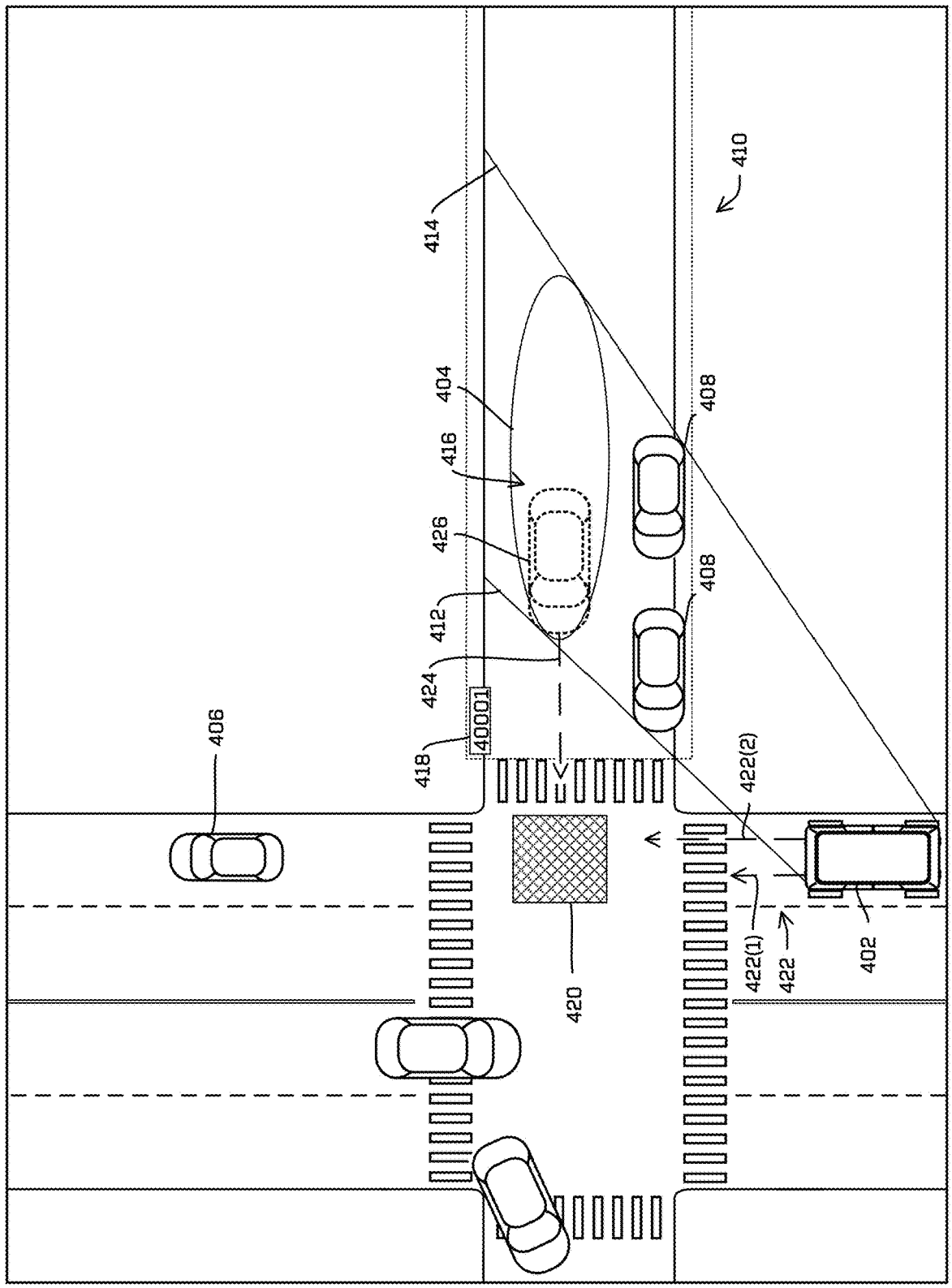
FIG. 4 depicts a vehicle in an environment, in which an example cost-based path determination system may be configured to identify an occlusion zone and determine an action to take based at least in part on the occlusion zone, in accordance with examples of the disclosure.

FIG. 4 is an illustration of a vehicle 402 in an environment 400, such as vehicle 102 in environment 100, in which an example cost-based action determination system may be configured to identify an occlusion zone 404 and determine an action to take based in part on the occlusion zone 404. The occlusion zone 404 may define a region in which the vehicle computing system may not be able to detect objects 406, such as objects 104, due to one or more obstacles 408 blocking the area associated with the occlusion zone 404. In the illustrative example, the occlusion zone 404 may include a portion of a road 410 blocked by obstacles 408 (e.g., parked cars). In other examples, the occlusion zone 404 may include sidewalks, pathways, bicycle lanes, or other areas in which a view of one or more objects 406 may be obstructed.

In various examples, the vehicle computing system may identify a forward boundary 412 and an aft boundary 414 of the occlusion zone 404. The forward boundary 412 may include a forward most line of the occlusion zone 404, in front of which the vehicle computing system may be configured to detect an object 406. The aft boundary 414 may include a farthest aft line of the occlusion zone 404, behind which the vehicle computing system may be configured to detect the object 406. In various examples, the vehicle computing system may be configured to identify one or more occluded road areas 416. The occluded road areas 416 may extend from the forward boundary to the aft boundary 414. The illustrative example, the occluded road area 416 is associated with a single lane of the section of road 410. In other examples, the occluded road area 416 may include two or more lanes associated with the section of the road 410 that are blocked by the obstacles 408 (e.g., drivable surface of the road that is blocked, two or more occluded road area 416 covering the occlusion zone 404).

In various examples, the vehicle computing system may be configured to determine an identifier 418 associated with the section of the road 410. The identifier 418 may represent a unique identifier associated with a portion of a road network utilized by the vehicle computing device to operate in the environment 400. The portions of the road network may be pre-defined, such as in map data stored on the vehicle computing device and/or accessible on via a remote computing device.

In some examples, the vehicle computing system may be configured to determine a probability that an object 406 may be traveling in the occlusion zone 404. In some examples, the vehicle computing system may determine the probability utilizing techniques such as those described in U.S. patent application Ser. No. 16/539,928, which is incorporated herein by reference above. In some examples, the vehicle computing system may determine one or more actions based in part on the probability that the object 406 may be traveling in the occlusion zone 404.

In some examples, the vehicle computing system may determine the action(s) 422 to perform responsive to determining the occlusion zone 404. In at least one example, the vehicle computing system may determine at least two actions 422. In such an example, a first action 422(1) of the at least two actions may include the vehicle progressing forward at a speed slow enough for the vehicle to stop prior to a collision zone 420 and a second action 422(2) of the at least two actions may include the vehicle progressing at a speed associated with clearing the collision zone 420 prior to a potential occluded object 426 associated with (e.g., located in) the occlusion zone 404 entering the collision zone 420.

In some examples, the vehicle computing system may determine additional actions 422 associated with various acceleration and/or velocity profiles and/or positional changes, such as within a lane (e.g., move left in a lane, move right in a lane, etc.). In various examples, the vehicle computing system may be configured to determine a pre-defined number of actions 422 for the vehicle 402 to perform. In some examples, the pre-defined number of actions 422 may be based on the occlusion zone 404. In some examples, the pre-defined number of actions 422 may be determined based on a size (e.g., length, width, etc.) of the occlusion zone 404, a shape of the occlusion zone 404, a number of lanes associated with the occlusion zone, a distance between the forward boundary 412 and the collision zone 420, the identifier 418 associated with the section of the road 410, and/or any other factors associated with the occlusion zone 404.

In various examples, the vehicle computing system may generate and run a simulation associated with each action 422, such as a first simulation associated with the first action 422(1) and a second simulation associated with the second action 422(2). The simulations may include the potential occluded object 426 (e.g., simulated occluded object 426). In the illustrative example, the simulated occluded object 426 may include an initial location that is proximate the forward boundary 412 of the occlusion zone 404. In some examples, the simulated occluded object 426 may include an initial location that is at another location within the occlusion zone 404 such that at least a portion of the simulated occluded object 426 is blocked from view of one or more sensors of the vehicle 402.

In various examples, the vehicle computing system may determine one or more predicted trajectories 424. As described above, the predicted object trajectories 424 may include paths and/or speeds the simulated occluded object 426 may travel through the environment. In some examples, the trajectories 424 may represent a predicted path and/or speed the simulated occluded object 426 may travel in response to an action the vehicle 402 takes. In some examples, the predicted object trajectories may include one or more acceleration profiles, such as acceleration profile 330 of FIG. 3. In various examples, the predicted object trajectories 424 may be determined utilizing machine learning algorithms trained with previously recorded sensor data associated with the identifier 418 (e.g., the section of road 410) and/or other techniques for determining object trajectories described herein. In various examples, the vehicle computing system may control the potential occluded object 426 in the simulation based at least in part on the predicted object trajectories 424.

In various examples, the vehicle computing system may determine one or more of a safety cost, a progress cost, a comfort cost, and/or an operational rules cost associated with each simulation (e.g., each action 422), as described above. Additionally or in the alternative, the vehicle computing system may determine an occlusion cost associated with each action 422. In some examples, the occlusion cost may be determined based on a speed of the vehicle 402 associated with each action 422 (e.g., independent of a predicted object trajectory 424). In some examples, the occlusion cost may include a progression penalty. The progression penalty may represent a cost associated with progressing through the collision zone 420 associated with the occlusion zone 404 based on the vehicle speed. In some examples, the progression penalty may be higher for faster speeds, to ensure safe operation of the vehicle 402. In some examples, the progression penalty may be determined utilizing the following equation:

$$\text{Progression Penalty} = \text{Gain}_{cz}(V^2 \times T_{veh\ cz}), \quad (1)$$

where V represents the vehicle speed, $T_{veh\ cz}$ represents a time associated with the vehicle 402 traveling through the collision zone 420 (e.g., time between the vehicle 402 entering an entry boundary and exiting an exit boundary), and the gain represents a tuning parameter for normalizing a value associated with the progression penalty, such as for an addition to or comparison with another value associated with another penalty and/or cost.

In some examples, the occlusion cost may include a blocking penalty associated with the vehicle 402 occupying space in front of the occlusion zone 404 for a period of time. In some examples, the blocking penalty may be determined utilizing the following equation:

$$\text{Blocking Penalty} = \text{Gain}_{block}(V \times T_{veh\ cz}), \quad (2)$$

where the blocking (illustrated as block gain) gain represents a tuning parameter for normalizing a value associated with the blocking penalty, such as for an addition to or comparison with another value associated with another penalty and/or cost.

In various examples, the occlusion cost may include a sum of the progression penalty and the blocking penalty. In some examples, the occlusion cost may be determined based on the probability that the vehicle 402 will affect an object 406 travel. In some examples, the occlusion cost may be determined utilizing the following equation:

$$O_{CC}\ \text{Cost} = \text{Prob}_{occluded\ obj}(\text{Gain}_{cz}(V^2 \times T_{veh\ cz}) + \text{Gain}_{block}(V \times T_{veh\ cz})) \quad (3)$$

Where the $\text{Prob}_{occluded\ obj}$ represents a probability that the vehicle 402 crossing in front of the occlusion zone 404 will affect a right of way of an object 406 associated with the occlusion zone 404. In some examples, the probability may be determined based on a distance between the occlusion zone 404 and the collision zone 420. In some examples, the probability may additionally or alternatively be determined based on a predicted object trajectory 424 of the occluded object 426. In various examples, the probability may be based in part on a time associated with the occluded object 426 traveling from a location associated with the occlusion zone 404 to the collision zone 420.

In various examples, the vehicle computing system may determine a cost associated with each action 422 based on one or more of the occlusion cost, the safety cost, the comfort cost, the progress cost, and the operational rules cost. In at least one example, the vehicle computing system may select the action 422 with the lowest cost for the vehicle to perform. The vehicle computing device may cause the vehicle to be controlled according to the selected action.

Figure 5:
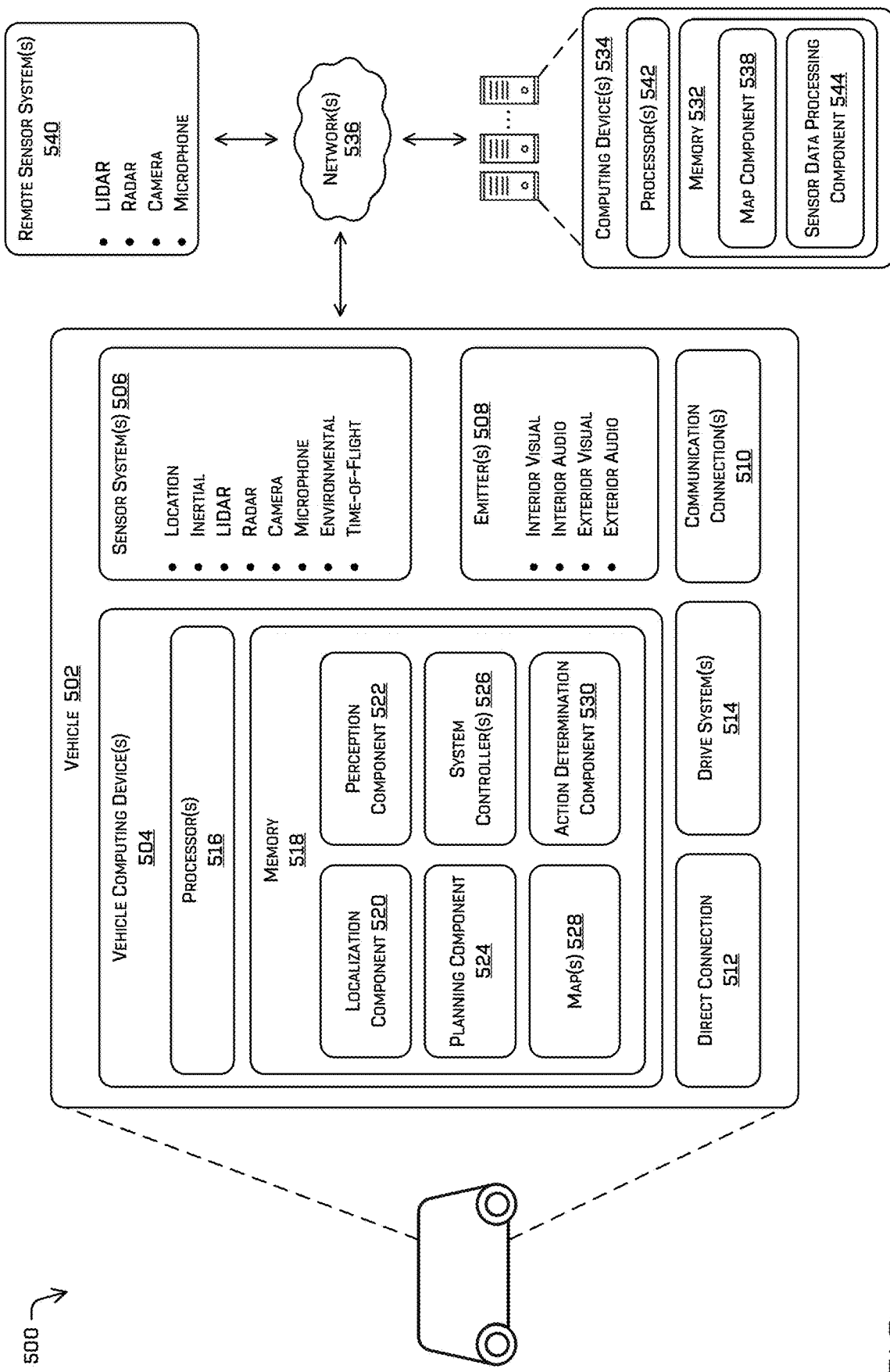
FIG. 5 is a block diagram of an example system for implementing the techniques described herein.

FIG. 5 is a block diagram of an example system 500 for implementing the techniques described herein. In at least one example, the system 500 may include a vehicle 502, such as vehicle 102.

The vehicle 502 may include one or more vehicle computing devices 504, such as the vehicle computing systems described herein, one or more sensor systems 506, one or more emitters 508, one or more communication connections 510, at least one direct connection 512, and one or more drive systems 514.

The vehicle computing device 504 may include one or more processors 516 and memory 518 communicatively coupled with the one or more processors 516. In the illustrated example, the vehicle 502 is an autonomous vehicle; however, the vehicle 502 could be any other type of vehicle, such as a semi-autonomous vehicle, or any other system having at least an image capture device (e.g., a camera enabled smartphone). In the illustrated example, the memory 518 of the vehicle computing device 504 stores a localization component 520, a perception component 522, a planning component 524, one or more system controllers 526, one or more maps 528, and an action determination component 530. Though depicted in FIG. 5 as residing in the memory 518 for illustrative purposes, it is contemplated that the localization component 520, a perception component 522, a planning component 524, one or more system controllers 526, one or more maps 528, and an action determination component 530 may additionally, or alternatively, be accessible to the vehicle 502 (e.g., stored on, or otherwise accessible by, memory remote from the vehicle 502, such as, for example, on memory 532 of a remote computing device 534).

In at least one example, the localization component 520 may include functionality to receive data from the sensor system(s) 506 to determine a position and/or orientation of the vehicle 502 (e.g., one or more of an x-, y-, z-position, roll, pitch, or yaw). For example, the localization component 520 may include and/or request/receive a map of an environment and may continuously determine a location and/or orientation of the autonomous vehicle within the map. In some instances, the localization component 520 may utilize SLAM (simultaneous localization and mapping), CLAMS (calibration, localization and mapping, simultaneously), relative SLAM, bundle adjustment, non-linear least squares optimization, or the like to receive image data, LIDAR data, radar data, IMU data, GPS data, wheel encoder data, and the like to accurately determine a location of the autonomous vehicle. In some instances, the localization component 520 may provide data to various components of the vehicle 502 to determine an initial position of an autonomous vehicle for generating a path polygon (e.g., vehicle corridor) associated with the vehicle path, as discussed herein.

In some instances, the perception component 522 may include functionality to perform object detection, segmentation, and/or classification. In some examples, the perception component 522 may provide processed sensor data that indicates a presence of an object (e.g., entity) that is proximate to the vehicle 502 and/or a classification of the object as an object type (e.g., car, pedestrian, cyclist, animal, building, tree, road surface, curb, sidewalk, unknown, etc.). In some examples, the perception component 522 may provide processed sensor data that indicates a presence of a stationary entity that is proximate to the vehicle 502 and/or a classification of the stationary entity as a type (e.g., building, tree, road surface, curb, sidewalk, unknown, etc.). In additional or alternative examples, the perception component 522 may provide processed sensor data that indicates one or more characteristics associated with a detected object (e.g., a tracked object) and/or the environment in which the object is positioned. In some examples, characteristics associated with an object may include, but are not limited to, an x-position (global and/or local position), a y-position (global and/or local position), a z-position (global and/or local position), an orientation (e.g., a roll, pitch, yaw), an object type (e.g., a classification), a velocity of the object (e.g., object speed), an acceleration of the object, an extent of the object (size), etc. Characteristics associated with the environment may include, but are not limited to, a presence of another object in the environment, a state of another object in the environment, a time of day, a day of a week, a season, a weather condition, an indication of darkness/light, etc.

In general, the planning component 524 may determine a path for the vehicle 502 to follow to traverse through an environment. In some examples, the planning component 524 may determine a vehicle corridor associated with vehicle 502 travel through the environment, such as vehicle corridor 106. For example, the planning component 524 may determine various routes and trajectories and various levels of detail. For example, the planning component 524 may determine a route to travel from a first location (e.g., a current location) to a second location (e.g., a target location). For the purpose of this discussion, a route may include a sequence of waypoints for travelling between two locations. As non-limiting examples, waypoints include streets, intersections, global positioning system (GPS) coordinates, etc. Further, the planning component 524 may generate an instruction for guiding the autonomous vehicle 502 along at least a portion of the route from the first location to the second location. In at least one example, the planning component 524 may determine how to guide the autonomous vehicle from a first waypoint in the sequence of waypoints to a second waypoint in the sequence of waypoints. In some examples, the instruction may be a trajectory, or a portion of a trajectory. In some examples, multiple trajectories may be substantially simultaneously generated (e.g., within technical tolerances) in accordance with a receding horizon technique, wherein one of the multiple trajectories is selected for the vehicle 502 to navigate.

In some examples, the planning component 524 may include a prediction component to generate predicted trajectories of objects in an environment. For example, a prediction component may generate one or more predicted trajectories for objects within a threshold distance from the vehicle 502, such as predicted object trajectories 108. In some examples, a prediction component may measure a trace of an object and generate a trajectory for the object based on observed and predicted behavior.

In at least one example, the vehicle computing device 504 may include one or more system controllers 526, which may be configured to control steering, propulsion, braking, safety, emitters, communication, and other systems of the vehicle 502. The system controller(s) 526 may communicate with and/or control corresponding systems of the drive system(s) 514 and/or other components of the vehicle 502.

The memory 518 may further include one or more maps 528 that may be used by the vehicle 502 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map may include, but is not limited to: texture information (e.g., color information (e.g., RGB color information, Lab color information, HSV/HSL color information), and the like), intensity information (e.g., LIDAR information, RADAR information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map may include a three-dimensional mesh of the environment. In some examples, the vehicle 502 may be controlled based at least in part on the map(s) 528. That is, the map(s) 528 may be used in connection with the localization component 520, the perception component 522, and/or the planning component 524 to determine a location of the vehicle 502, detect objects in an environment, and/or generate routes and/or trajectories to navigate within an environment.

In various examples, the map(s) 528 may be utilized by the vehicle computing device 504 to determine a right of way, such as at an intersection. The right of way may indicate an entity (e.g., the vehicle 502 or an object) that has priority at the intersection or other junction. In various examples, the map(s) 528 may indicate the right of way based on a vehicle location, direction of travel, object location, object direction of travel, object predicted trajectory, or the like.

In some examples, the one or more maps 528 may be stored on a remote computing device(s) (such as the computing device(s) 534) accessible via network(s) 536, such as in map component 538. In some examples, multiple maps 528 may be stored based on, for example, a characteristic (e.g., type of entity, time of day, day of week, season of the year, etc.). Storing multiple maps 528 may have similar memory requirements, but increase the speed at which data in a map may be accessed.

As illustrated in FIG. 5, the vehicle computing device 504 may include an action determination component 530. The action determination component 530 may be configured to determine, based at least in part on detected object location and/or trajectories, an action for the vehicle to take. As described above with regard to FIGS. 1-4, the action determination component 530 may be configured to determine whether to cause the vehicle 502 to yield to an object traveling on a crossing or merging path with a path of the vehicle 502. Based on a determination of whether to yield, the action determination component 530 may send the planning component 524 a signal to perform the action (e.g., control vehicle according to one or more vehicle trajectories associated with the action). For example, the action determination component 530 may determine that the vehicle, traveling along a first acceleration and/or speed profile, can safely proceed ahead of an object in a lane without a potential for collision (e.g., probability of collision below a threshold) and that the vehicle may maintain a vehicle trajectory. The action determination component 530 may provide a signal to the planning component 524 to cause the vehicle to maintain the vehicle trajectory.

As can be understood, the components discussed herein (e.g., the localization component 520, the perception component 522, the planning component 524, the one or more system controllers 526, the one or more maps 528, and the action determination component 530 are described as divided for illustrative purposes. However, the operations performed by the various components may be combined or performed in any other component.

In some instances, aspects of some or all of the components discussed herein may include any models, techniques, and/or machine learning techniques. For example, in some instances, the components in the memory 518 (and the memory 532, discussed below) may be implemented as a neural network.

As described herein, an exemplary neural network is a biologically inspired technique which passes input data through a series of connected layers to produce an output. Each layer in a neural network may also comprise another neural network, or may comprise any number of layers (whether convolutional or not). As can be understood in the context of this disclosure, a neural network may utilize machine learning, which may refer to a broad class of such techniques in which an output is generated based on learned parameters.

Although discussed in the context of neural networks, any type of machine learning may be used consistent with this disclosure. For example, machine learning techniques may include, but are not limited to, regression techniques (e.g., ordinary least squares regression (OLSR), linear regression, logistic regression, stepwise regression, multivariate adaptive regression splines (MARS), locally estimated scatterplot smoothing (LOESS)), instance-based techniques (e.g., ridge regression, least absolute shrinkage and selection operator (LASSO), elastic net, least-angle regression (LARS)), decisions tree techniques (e.g., classification and regression tree (CART), iterative dichotomiser 3 (ID3), Chi-squared automatic interaction detection (CHAID), decision stump, conditional decision trees), Bayesian techniques (e.g., naïve Bayes, Gaussian naïve Bayes, multinomial naïve Bayes, average one-dependence estimators (AODE), Bayesian belief network (BNN), Bayesian networks), clustering techniques (e.g., k-means, k-medians, expectation maximization (EM), hierarchical clustering), association rule learning techniques (e.g., perceptron, back-propagation, hopfield network, Radial Basis Function Network (RBFN)), deep learning techniques (e.g., Deep Boltzmann Machine (DBM), Deep Belief Networks (DBN), Convolutional Neural Network (CNN), Stacked Auto-Encoders), Dimensionality Reduction Techniques (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Techniques (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet50, ResNet101, VGG, DenseNet, PointNet, and the like.

In at least one example, the sensor system(s) 506 may include lidar sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, time of flight, etc.), microphones, wheel encoders, environment sensors (e.g., temperature sensors, humidity sensors, light sensors, pressure sensors, etc.), etc. The sensor system(s) 506 may include multiple instances of each of these or other types of sensors. For instance, the LIDAR sensors may include individual LIDAR sensors located at the corners, front, back, sides, and/or top of the vehicle 502. As another example, the camera sensors may include multiple cameras disposed at various locations about the exterior and/or interior of the vehicle 502. The sensor system(s) 506 may provide input to the vehicle computing device 504. Additionally or in the alternative, the sensor system(s) 506 may send sensor data, via the one or more networks 536, to the one or more computing device(s) 534 at a particular frequency, after a lapse of a predetermined period of time, in near real-time, etc.

The vehicle 502 may also include one or more emitters 508 for emitting light and/or sound, as described above. The emitters 508 in this example include interior audio and visual emitters to communicate with passengers of the vehicle 502. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), and the like. The emitters 508 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 502 may also include one or more communication connection(s) 510 that enable communication between the vehicle 502 and one or more other local or remote computing device(s). For instance, the communication connection(s) 510 may facilitate communication with other local computing device(s) on the vehicle 502 and/or the drive system(s) 514. Also, the communication connection(s) 510 may allow the vehicle to communicate with other nearby computing device(s) (e.g., computing device(s) 534, other nearby vehicles, etc.) and/or one or more remote sensor system(s) 540 for receiving sensor data.

The communications connection(s) 510 may include physical and/or logical interfaces for connecting the vehicle computing device 504 to another computing device or a network, such as network(s) 536. For example, the communications connection(s) 510 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.) or any suitable wired or wireless communications protocol that enables the respective computing device to interface with the other computing device(s).

In at least one example, the vehicle 502 may include one or more drive systems 514. In some examples, the vehicle 502 may have a single drive system 514. In at least one example, if the vehicle 502 has multiple drive systems 514, individual drive systems 514 may be positioned on opposite ends of the vehicle 502 (e.g., the front and the rear, etc.). In at least one example, the drive system(s) 514 may include one or more sensor systems to detect conditions of the drive system(s) 514 and/or the surroundings of the vehicle 502. By way of example and not limitation, the sensor system(s) may include one or more wheel encoders (e.g., rotary encoders) to sense rotation of the wheels of the drive modules, inertial sensors (e.g., inertial measurement units, accelerometers, gyroscopes, magnetometers, etc.) to measure orientation and acceleration of the drive module, cameras or other image sensors, ultrasonic sensors to acoustically detect objects in the surroundings of the drive module, LIDAR sensors, radar sensors, etc. Some sensors, such as the wheel encoders may be unique to the drive system(s) 514. In some cases, the sensor system(s) on the drive system(s) 514 may overlap or supplement corresponding systems of the vehicle 502 (e.g., sensor system(s) 506).

The drive system(s) 514 may include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 514 may include a drive module controller which may receive and preprocess data from the sensor system(s) and to control operation of the various vehicle systems. In some examples, the drive module controller may include one or more processors and memory communicatively coupled with the one or more processors. The memory may store one or more modules to perform various functionalities of the drive system(s) 514. Furthermore, the drive system(s) 514 may also include one or more communication connection(s) that enable communication by the respective drive module with one or more other local or remote computing device(s).

In at least one example, the direct connection 512 may provide a physical interface to couple the one or more drive system(s) 514 with the body of the vehicle 502. For example, the direct connection 512 may allow the transfer of energy, fluids, air, data, etc. between the drive system(s) 514 and the vehicle. In some instances, the direct connection 512 may further releasably secure the drive system(s) 514 to the body of the vehicle 502.

In at least one example, the localization component 520, the perception component 522, the planning component 524, the one or more system controllers 526, the one or more maps 528, and the action determination component 530 and various components thereof, may process sensor data, as described above, and may send their respective outputs, over the one or more network(s) 536, to the computing device(s) 534. In at least one example, the localization component 520, the perception component 522, the planning component 524, the one or more system controllers 526, the one or more maps 528, and the action determination component 530 may send their respective outputs to the computing device(s) 534 at a particular frequency, after a lapse of a predetermined period of time, in near real-time, etc.

In some examples, the vehicle 502 may send sensor data to the computing device(s) 534 via the network(s) 536. In some examples, the vehicle 502 may receive sensor data from the computing device(s) 534 via the network(s) 536. The sensor data may include raw sensor data and/or processed sensor data and/or representations of sensor data. In some examples, the sensor data (raw or processed) may be sent and/or received as one or more log files.

The computing device(s) 534 may include processor(s) 542 and a memory 532 storing the map component 538 and a sensor data processing component 544. In some examples, the map component 538 may include functionality to generate maps of various resolutions. In such examples, the map component 538 may send one or more maps to the vehicle computing device 504 for navigational purposes. In various examples, the sensor data processing component 544 may be configured to receive data from one or more remote sensors, such as sensor systems 506 and/or remote sensor system(s) 540. In some examples, the sensor data processing component 544 may be configured to process the data and send action determination component 530. In some examples, the sensor data processing component 544 may be configured to send raw sensor data to the vehicle computing device(s) 504.

The processor(s) 516 of the vehicle 502 and the processor(s) 542 of the computing device(s) 534 may be any suitable processor capable of executing instructions to process data and perform operations as described herein. By way of example and not limitation, the processor(s) 516 and 542 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

Memory 518 and 532 are examples of non-transitory computer-readable media. The memory 518 and 532 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 518 and 532 may include at least a working memory and a storage memory. For example, the working memory may be a high-speed memory of limited capacity (e.g., cache memory) that is used for storing data to be operated on by the processor(s) 516 and 542. In some instances, the memory 518 and 532 may include a storage memory that may be a lower-speed memory of relatively large capacity that is used for long-term storage of data. In some cases, the processor(s) 516 and 542 cannot operate directly on data that is stored in the storage memory, and data may need to be loaded into a working memory for performing operations based on the data, as discussed herein.

It should be noted that while FIG. 5 is illustrated as a distributed system, in alternative examples, components of the vehicle 502 may be associated with the computing device(s) 534 and/or components of the computing device(s) 534 may be associated with the vehicle 502. That is, the vehicle 502 may perform one or more of the functions associated with the computing device(s) 534, and vice versa.

Figure 6:
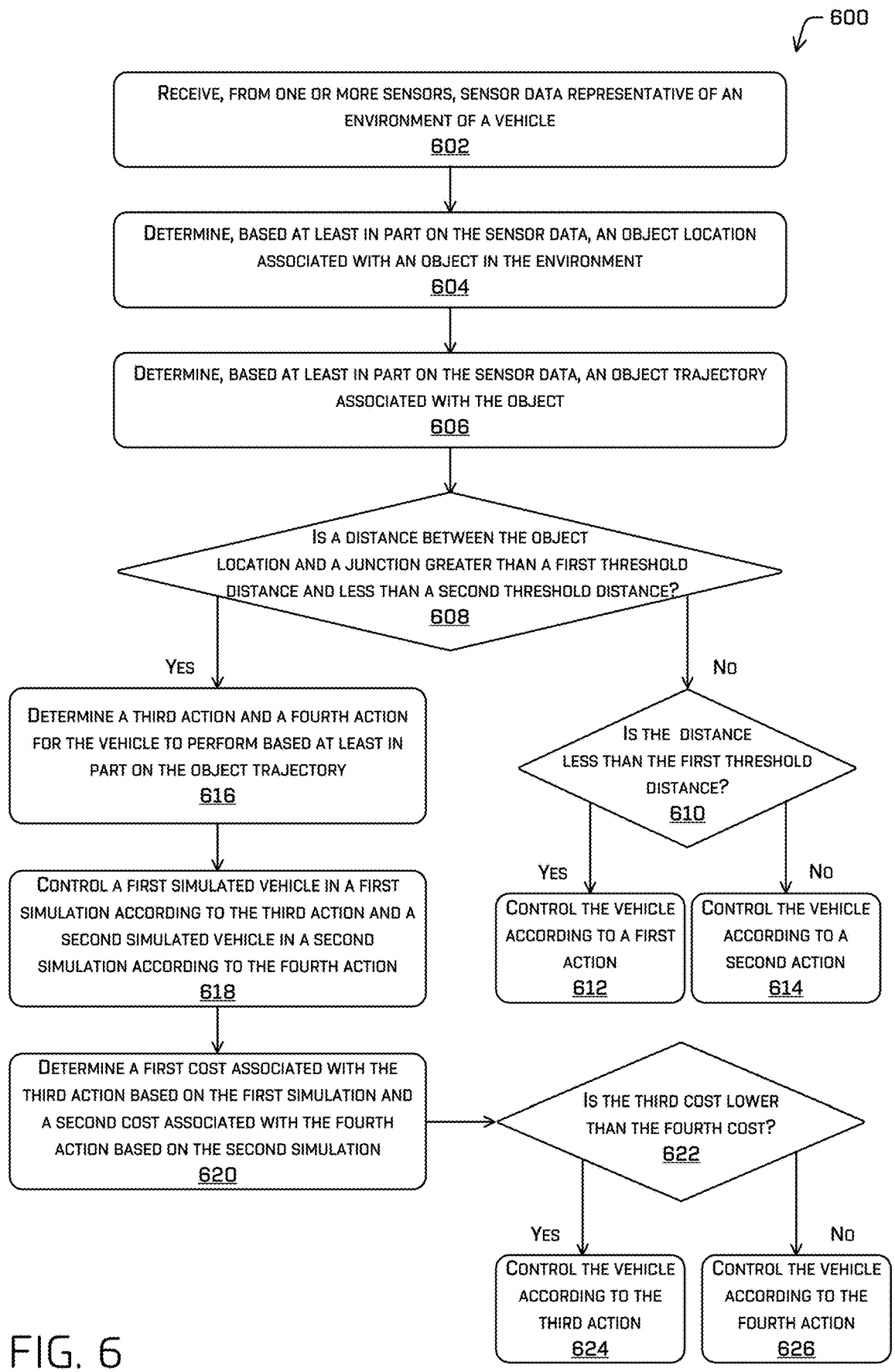
FIG. 6 depicts an example process for controlling a vehicle according to an action based at least in part on a cost associated with the action, in accordance with examples of the disclosure.
Figure 7:
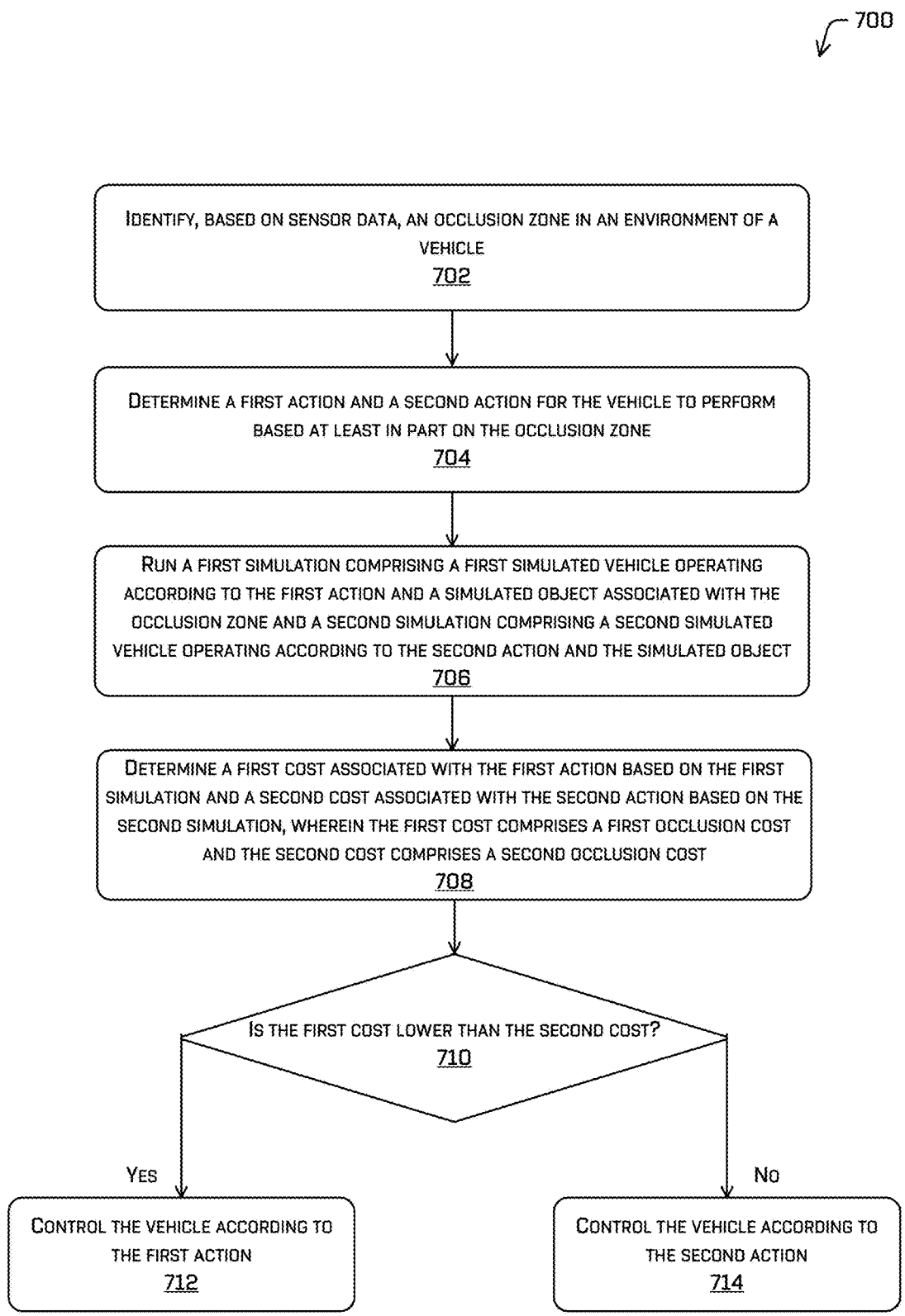
FIG. 7 depicts an example process for controlling a vehicle based at least in part on a detected occlusion zone, in accordance with examples of the disclosure.

FIGS. 2, 6, and 7 illustrate example processes in accordance with examples of the disclosure. These processes are illustrated as logical flow graphs, each operation of which represents a sequence of operations that may be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations may be combined in any order and/or in parallel to implement the processes.

FIG. 6 depicts an example process 600 for controlling a vehicle according to an action based at least in part on a cost associated with the action, in accordance with examples of the disclosure. For example, some or all of the process 600 may be performed by one or more components in FIG. 5, as described herein. For example, some or all of the process 600 may be performed by the vehicle computing device(s) 504.

At operation 602, the process includes receiving, from one or more sensors, sensor data representative of an environment of a vehicle. The sensor(s) may include cameras, motion detectors, lidar, radar, time of flight, or the like. The sensor(s) may be mounted on the vehicle and/or may include sensor(s) that are remote to the vehicle (e.g., mounted on other vehicles, mounted in the environment, etc.).

At operation 604, the process includes determining, based at least in part on the sensor data, an object location associated with the object in the environment. In various examples, the vehicle computing system may determine the object location based on a determination that the object is within a proximity to the vehicle and/or a junction associated therewith.

At operation 606, the process includes determining, based at least in part on the sensor data, an object trajectory associated with the object. The object trajectory may represent a potential path that the object may travel through the environment. In various examples, the object trajectory may be determined utilizing a top-down representation of an environment, a heat map, temporal logic formulae, tree search methods, machine learning techniques, or other means of determining active prediction associated with objects in an environment, as described in the U.S. patent applications incorporated by reference herein.

In various examples, the vehicle computing system may determine an object corridor based in part on the object trajectory and/or the object location. The object corridor may represent an area over which the object may travel in the environment. In some examples, the area associated with the object corridor may be defined by a length and/or width of the object plus a safety buffer. In some examples, the area associated with the object corridor may be determined based on an object type associated with the object. In such examples, the vehicle computing system may be configured to determine the object type. In at least one example, an overlap of the object corridor and a vehicle corridor associated with a planned path of the vehicle may represent the collision zone.

At operation 608, the process includes determining whether a distance between the object location and the junction is greater than a first threshold distance and less than a second threshold distance. The first threshold distance may include a minimum distance to the junction, representative of a yielding action (e.g., vehicle yields to the object). The second threshold distance may include a maximum distance to the junction at or above which the vehicle can safely proceed through the junction with minimal or no impact on the object travel. In various examples, the first threshold distance and/or the second threshold distance may be determined based on the object trajectory (e.g., as a function of the object trajectory). In some examples, the vehicle computing system may determine the first threshold distance and/or the second threshold distance based in part on a speed and/or change in speed of the object.

Based on a determination that the distance is either equal to or less than the first threshold distance or equal to or greater than the second threshold distance (e.g., "No" at operation 608), the process, at operation 610 includes determining whether the distance is less than the first threshold distance. Based on a determination that the distance is less than the first threshold distance ("Yes" at operation 610), the process, at operation 612 includes controlling the vehicle according to a first action. In various examples, the first action may include a yielding action. The yielding action may include the vehicle maintaining a stopped position, slowing to a stop, or proceeding at a slow speed to enable the object to proceed.

Based on a determination that the distance is not less than the first threshold distance and thus is equal to or greater than the second threshold distance ("No" at operation 610), the process, at operation 614 includes controlling the vehicle according to a second action. The second action may include an action to proceed through the junction along the vehicle path in front of the object. For example, based on a determination that the object is greater than the second threshold distance from the junction such that the vehicle can safely proceed therethrough without affecting the object travel, the vehicle computing system controls the vehicle according to an acceleration and/or speed profile through the junction toward a vehicle destination.

Based on a determination that the distance is greater than the first threshold distance and less than the second threshold distance (e.g., "Yes" at operation 608), the process, at operation 616, incudes determining a third action and a fourth action for the vehicle to perform based at least in part on the object trajectory. The third action and the fourth action may represent potential paths the vehicle could take through the environment (e.g., one or more vehicle trajectories). The third action and the fourth action may include one or more reference actions (e.g., one of a group of maneuvers the vehicle is configured to perform in reaction to a dynamic operating environment) such as staying in a lane, a lane change maneuver, going around an obstacle (e.g., double-parked vehicle, traffic cones, etc.), or the like. The third action and the fourth action may additionally include one or more sub-actions, such as speed variations (e.g., maintain velocity, accelerate, decelerate, etc.), positional variations (e.g., changing a position in a lane), or the like. For example, a third action may include staying in a lane (reference action) and accelerating according to an acceleration profile to proceed ahead of a detected object (sub-action). In at least one example, at least one of the third action or the fourth action may include a conservative action, such as yielding to the object or proceeding at a slow speed (e.g., creep) based on an occlusion zone, and the other of the third action or the fourth action may include a more assertive action, such as proceeding through the collision zone ahead of the object.

At operation 618, the process includes controlling a first simulated vehicle in a first simulation according to the third action and a second simulated vehicle in a second simulation according to the fourth action. In various examples, the first simulation and the second simulation may include simulated objects representative of the object detected in the environment. In at least one example, the simulated object(s) may include a crossing object, a merging object, or an occluded object. In various examples, the vehicle computing system may cause the simulated object(s) to travel through the environment based on the predicted object trajectories.

In some examples, the vehicle computing system may cause one or more of the simulated object(s) to travel according to one or more acceleration profiles. In some examples, the acceleration profiles may represent a maximum acceleration and a minimum acceleration predicted for the object to follow. In some examples, the maximum acceleration and the minimum acceleration may be determined based on the vehicle action (e.g., first action or the second action). For example, the third action may include the vehicle yielding to the object. The vehicle computing system may determine a minimum and maximum accelerations predicted for the object to travel through the environment. The fourth action may include the vehicle proceeding through a junction ahead of the object. The vehicle computing system may determine a minimum and maximum acceleration (e.g., negative accelerations) predicted for the object to travel through the environment, such as based on the vehicle proceeding ahead of the object. In various examples, the minimum and/or maximum accelerations associated with an action may represent a prediction of an object reaction to the vehicle performing the respective action.

At operation 620, the process includes determining a first cost associated with the third action based on the first simulation and a second cost associated with the fourth action based on the second simulation. In various examples, the first cost and/or the second cost may include a safety cost, a comfort cost, a progress cost, an operational rules cost, and/or an occlusion cost, as described above. In at least one example, the first cost and the second cost include a safety cost. In some examples, the safety cost may be determined based in part on a heat map associated with one or more predicted distances between the vehicle and the object. In such examples, the vehicle computing system generates the heat map associated with simulation.

At operation 622, the process includes determining whether the first cost is lower than the second cost. In the illustrative example, an optimal action may be associated with a lowest cost action. In other examples, the optimal action may be associated with a highest cost action. In such examples, the vehicle computing system may determine whether the first cost is higher than the second cost.

Based on a determination that the first cost is lower than the second cost ("Yes" at operation 622), the process, at operation 624, includes controlling the vehicle according to the third action. Based on a determination that the second cost is lower than the first cost ("No" at operation 622), the process, at operation 626, includes controlling the vehicle according to the fourth action.

FIG. 7 depicts an example process 700 for controlling a vehicle based at least in part on a detected occlusion zone, in accordance with examples of the disclosure. For example, some or all of the process 700 may be performed by one or more components in FIG. 5, as described herein. For example, some or all of the process 700 may be performed by the vehicle computing device(s) 504.

At operation 702, the process includes identifying, based on sensor data, an occlusion zone in an environment of a vehicle. The sensor data may include data captured by one or more sensors mounted on the vehicle and/or one or more remote sensors (e.g., mounted on other vehicles, mounted in the environment, etc.). The occlusion zone may define a region in which the vehicle computing system may not be able to detect objects due to one or more obstacles blocking the area associated with the occlusion zone. The occlusion zone 404 may include a portion of a road, sidewalks, pathways, bicycle lanes, or other areas in which a view of one or more objects may be obstructed.

At operation 704, the process includes determining a first action and a second action for the vehicle to perform based at least in part on the occlusion zone. In at least one example, at least one of the first action or the second action includes a conservative action, such as progressing slowly until the occlusion zone is visible by one or more sensors of the vehicle, and the other of the first action or the second action includes a more assertive action, such as proceeding through a junction associated with the occlusion zone.

At operation 706, the process includes running a first simulation comprising a first simulated vehicle operating according to the first action and a simulated occluded object associated with the occlusion zone and a second simulation comprising a second simulated vehicle operating according to the second action and the simulated occluded object. In some examples, the vehicle computing system may control the simulated occluded object in the respective scenarios according to an object trajectory and/or an acceleration profile. The object trajectory may be determined based on a speed limit, previously captured sensor data, or the like. In at least one example, the object trajectory may be determined utilizing machine learning techniques.

In some examples, the acceleration profile may be associated with the respective action and/or a type of action (e.g., assertive, conservative, etc.). For example, a conservative action of the vehicle may have associated therewith a first object acceleration profile and an assertive vehicle action may have associated therewith a second object acceleration profile that is different from the first acceleration profile. In various examples, the vehicle computing system may determine one or more simulated future states of the vehicle and the simulated occluded object. In some examples, the vehicle computing system may generate a heat map associated with the simulated future states of the vehicle and the simulated occluded object, such as based on predicted distances therebetween.

At operation 708, the process includes determining a first cost associated with the first action based on the first simulation and a second cost associated with the second action based on the second simulation, wherein the first cost comprises a first occlusion cost and the second cost comprises a second occlusion cost.

In various examples, the first occlusion cost and the second occlusion cost may include respective progression penalties and blocking penalties, as described above. The progression penalty may include a penalty for proceeding in front of an occlusion zone and a potential occluded object associated therewith. The blocking penalty may include a penalty for potentially blocking a path of the potential occluded object. The respective progression penalty and blocking penalty may be determined based on speeds associated with respective actions.

In some examples, the first occlusion cost and the second occlusion cost may include a sum of respective progression penalties and the blocking penalties multiplied by a probability that the respective action will affect the occluded object's travel (e.g., right of way of the object). In some examples, the probability may be determined based on a distance between the occlusion zone and a collision zone. In some examples, the probability may additionally be determined based on a predicted object trajectory of the occluded object. In various examples, the probability may be based in part on a time associated with the occluded object traveling from the occlusion zone to the collision zone.

At operation 710, the process includes determining whether the first cost is lower than the second cost. In the illustrative example, an optimal action may be associated with a lowest cost action. In other examples, the optimal action may be associated with a highest cost action. In such examples, the vehicle computing system may determine whether the first cost is higher than the second cost.

Based on a determination that the first cost is lower than the second cost ("Yes" at operation 710), the process, at operation 712, includes controlling the vehicle according to the first action. Based on a determination that the second cost is lower than the first cost ("No" at operation 710), the process, at operation 714, includes controlling the vehicle according to the second action.

Example Clauses

A: A system comprising: one or more processors; and one or more non-transitory computer-readable media storing instructions executable by the one or more processors, wherein the instructions, when executed, cause the system to perform operations comprising: determining a predicted object trajectory of an object traveling through an environment proximate a vehicle; determining, based at least in part on an object location associated with the object, that the object is located between a first threshold distance and a second threshold distance of an intersection of the predicted object trajectory and a vehicle trajectory of the vehicle, wherein the first threshold distance and the second threshold distance are determined based at least in part on the predicted object trajectory; determining, based at least in part on the object being located between the first threshold distance and the second threshold distance of the intersection of the predicted object trajectory and the vehicle trajectory, a first action and a second action for the vehicle to perform; controlling a first simulated vehicle in a first simulation according to the first action and a second simulated vehicle in a second simulation according to the second action, wherein the first simulation and the second simulation represent the vehicle traveling in the environment at a future time; determining a first cost associated with the first action based at least in part on the first simulation and a second cost associated with the second action based at least in part on the second simulation; determining that the first cost associated with the first action is lower than the second cost associated with the second action; and based at least in part on determining that the first cost is lower than the second cost, controlling the vehicle based at least in part on the first action.

B: The system of paragraph A, the first action comprising: determining to maintain a vehicle trajectory and proceed ahead of the object; determining to modify a speed associated with the vehicle trajectory to proceed into a junction associated with the object; or determining to modify the vehicle trajectory to yield to the object.

C: The system of either paragraph A or paragraph B, wherein the first cost and the second cost comprise at least two of: a safety cost; an occlusion cost; a comfort cost; a progress cost; or an operational rule cost.

D: The system of any one of paragraphs A-C, the operations further comprising: identifying an occlusion zone associated with the environment; associating a simulated object with the first simulation and the second simulation, wherein the simulated object is located in the occlusion zone; and determining a first occlusion cost associated with the first simulation and a second occlusion cost associated with the second simulation based at least in part on the simulated object, wherein the first cost comprises the first occlusion cost and the second cost comprises the second occlusion cost.

E: The system of any one of paragraphs A-D, the operations further comprising: determine a third action for the vehicle to take in the environment; control a third simulated vehicle in a third simulation according to the third action; determine, prior to a completion of the third simulation, that a safety cost associated with the third action is greater than a threshold safety cost; and terminate the third simulation.

F: A computer-implemented method comprising: determining, based at least in part on sensor data, a predicted object trajectory associated with an object in an environment proximate a vehicle; determining, based at least in part on the predicted object trajectory and a vehicle trajectory, to perform an action, wherein the action comprises: a first action if the distance of the object to a reference point is less than or equal to a first threshold distance, a second action if the distance of the object to a reference point is greater than or equal to a second threshold distance, or a third action determined based at least in part on: simulating the vehicle performing a first simulated action to determine a first cost; simulating the vehicle performing a second simulated action to determine a second cost; and determining, as the third action and based at least in part on the first cost being less than or equal to the second cost, the first simulated action; and causing the vehicle to be controlled according to the action.

G: The computer-implemented method of paragraph F, further comprising: determining a potential collision zone between the vehicle and the object based at least in part on the vehicle trajectory and the object trajectory; determining a distance between a vehicle location and the potential collision zone, wherein the first simulated action and the second simulated action are determined based at least in part on the distance between the vehicle location and the potential collision zone.

H: The computer-implemented method of either paragraph F or paragraph G, wherein each of the first simulated action and the second simulated action comprises one of: proceeding into a junction associated with the vehicle and the object at a first speed; proceeding into the junction at a second speed that is greater than the first speed; or yielding to the object.

I: The computer-implemented method of any one of paragraphs F-H, wherein at least one of the first cost or the second cost comprises: a safety cost; an occlusion cost; a comfort cost; a progress cost; or an operational rule cost.

J: The computer-implemented method of any one of paragraphs F-I, further comprising: identifying an occlusion zone associated with the environment; associating a simulated object with a first simulation associated with simulating the vehicle performing the first simulated action and a second simulation associated with simulating the vehicle performing the second simulated action, wherein the simulated object is located in the occlusion zone; and determining a first occlusion cost associated with the first simulation and a second occlusion cost associated with the second simulation based at least in part on the simulated object, wherein the first cost comprises the first occlusion cost and the second cost comprises the second occlusion cost.

K: The computer-implemented method of paragraph J, wherein determining the first occlusion cost and the second occlusion cost comprises: determining a first vehicle velocity associated with the first simulated action and a second vehicle velocity associated with the second simulated action; determining a first progression penalty associated with the first simulated action and a second progression penalty associated with the second simulated action, wherein the first progression penalty and the second progression penalty are based at least in part on squared values of the first vehicle velocity and the second vehicle velocity, respectively; and determining a first blocking penalty associated with the first simulated action and a second blocking penalty associated with the second simulated action, wherein the first blocking penalty and the second blocking penalty are based at least in part on the values of the first vehicle velocity and the second vehicle velocity, respectively, wherein the first occlusion cost comprises the first progression penalty and the first blocking penalty and the second occlusion cost comprises the second progression penalty and the second blocking penalty.

L: The computer-implemented method of any one of paragraphs F-K, wherein the second simulated action is associated with the vehicle proceeding ahead of the object, the object being a first object and wherein determining the second cost comprises: determining a second object trajectory associated with a second object in the environment; determining, based at least in part on the second object trajectory, that the second object is relevant to a path of the vehicle; determining that a probability that the vehicle will perform a yielding action responsive to the second object at a future time is above a threshold probability; and determining a penalty associated with the yielding action, wherein the second cost comprises the penalty.

M: The computer-implemented method of any one of paragraphs F-L, further comprising determining prior to a completion of simulating the vehicle performing the first simulated action that a safety cost associated with the first simulated action is greater than or equal to a threshold safety cost; and terminating the simulation based at least in part on the safety cost being greater than or equal to the threshold safety cost.

N: The method of any one of paragraphs F-M, wherein the first action comprises yielding to the object.

O: A system or device comprising: a processor; and a non-transitory computer-readable medium storing instructions that, when executed, cause a processor to perform a computer-implemented method as any one of paragraphs F-N describe.

P: A system or device comprising: a means for processing; and a means for storing coupled to the means for processing, the means for storing including instructions to configure one or more devices to perform a computer-implemented method as any one of paragraphs F-N describe.

Q: One or more non-transitory computer-readable media storing instructions that, when executed, cause one or more processors to perform operations comprising: determining, based at least in part on sensor data, a predicted object trajectory associated with an object in an environment proximate a vehicle; determining, based at least in part on the predicted object trajectory and a vehicle trajectory, to perform an action, wherein the action comprises: a first action if the distance of the object to a reference point is less than or equal to a first threshold distance, a second action if the distance of the object to a reference point is greater than or equal to a second threshold distance, or a third action determined based at least in part on: simulating the vehicle performing a first simulated action to determine a first cost; simulating the vehicle performing a second simulated action to determine a second cost; and determining, as the third action and based at least in part on the first cost being less than or equal to the second cost, the first simulated action; and causing the vehicle to be controlled according to the action.

R: The one or more non-transitory computer-readable media of paragraph Q, the operations further comprising: determining a potential collision zone between the vehicle and the object based at least in part on the vehicle trajectory and the object trajectory; determining a distance between a vehicle location and the potential collision zone, wherein the first simulated action and the second simulated action are determined based at least in part on the distance between the vehicle location and the potential collision zone.

S: The one or more non-transitory computer-readable media of either paragraph Q or paragraph R, wherein each of the first simulated action and the second simulated action comprises one of: proceeding into a junction associated with the vehicle and the object at a first speed; proceeding into the junction at a second speed that is greater than the first speed; or yielding to the object.

T: The one or more non-transitory computer-readable media of any one of paragraphs Q-S, wherein each of the first cost and the second cost comprises at least one of: a safety cost; an occlusion cost; a comfort cost; a progress cost; or an operational rule cost.

U: The one or more non-transitory computer-readable media of any one of paragraphs Q-T, wherein the second simulated action is associated with the vehicle proceeding ahead of the object, the object being a first object and wherein determining the second cost comprises: determining a second object trajectory associated with a second object in the environment; determining, based at least in part on the second object trajectory, that the second object is relevant to a path of the vehicle; determining that a probability that the vehicle will perform a yielding action in response to the second object at a future time is above a threshold probability; and determining a penalty associated with the yielding action, wherein the second cost comprises the penalty.

V: The one or more non-transitory computer-readable media of any one of paragraphs Q-U, the operations further comprising: determining prior to a completion of simulating the vehicle performing the first simulated action that a safety cost associated with the first simulated action is greater than or equal to a threshold safety cost; and terminating the simulation based at least in part on the safety cost being greater than or equal to the threshold safety cost.

While the example clauses described above are described with respect to one particular implementation, it should be understood that, in the context of this document, the content of the example clauses can also be implemented via a method, device, system, a computer-readable medium, and/or another implementation. Additionally, any of examples A-V may be implemented alone or in combination with any other one or more of the examples A-V.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
one or more processors; and
one or more non-transitory computer-readable media storing instructions executable by the one or more processors, wherein the instructions, when executed, cause the system to perform operations comprising:
determining a predicted object trajectory of an object traveling through an environment proximate a vehicle;
determining, based at least in part on an object location associated with the object, that the object is located between a minimum threshold distance and a maximum threshold distance of an intersection of the predicted object trajectory and a vehicle trajectory of the vehicle, wherein the minimum threshold distance and the maximum threshold distance are determined based at least in part on the predicted object trajectory, wherein the minimum threshold distance is different from the maximum threshold distance;
determining, based at least in part on the object being located between the minimum threshold distance and the maximum threshold distance of the intersection of the predicted object trajectory and the vehicle trajectory, a first action and a second action for the vehicle to perform;
controlling a first simulated vehicle in a first simulation according to the first action and a second simulated vehicle in a second simulation according to the second action, wherein the first simulation and the second simulation represent the vehicle traveling in the environment at a future time;
determining a first cost associated with the first action based at least in part on the first simulation and a second cost associated with the second action based at least in part on the second simulation;
determining that the first cost associated with the first action is lower than the second cost associated with the second action; and
based at least in part on determining that the first cost is lower than the second cost, controlling the vehicle based at least in part on the first action.

2. The system of claim 1, the first action comprising:
determining to maintain the vehicle trajectory of the vehicle and proceed ahead of the object;
determining to modify a speed associated with the vehicle trajectory to proceed into a junction associated with the object; or
determining to modify the vehicle trajectory to yield to the object.

3. The system of claim 1, wherein the first cost and the second cost comprise at least two of:
a safety cost;
an occlusion cost;
a comfort cost;
a progress cost; or
an operational rule cost.

4. The system of claim 1, the operations further comprising:
identifying an occlusion zone associated with the environment;
associating a simulated object with the first simulation and the second simulation, wherein the simulated object is located in the occlusion zone; and
determining a first occlusion cost associated with the first simulation and a second occlusion cost associated with the second simulation based at least in part on the simulated object,
wherein the first cost comprises the first occlusion cost and the second cost comprises the second occlusion cost.

5. The system of claim 1, the operations further comprising:
determine a third action for the vehicle to take in the environment;
control a third simulated vehicle in a third simulation according to the third action;
determine, prior to a completion of the third simulation, that a safety cost associated with the third action is greater than a threshold safety cost; and
terminate the third simulation.

6. A method comprising:
determining, based at least in part on sensor data, a predicted object trajectory associated with an object in an environment proximate a vehicle;
determining, based at least in part on the predicted object trajectory and a vehicle trajectory, to perform an action, wherein the action comprises:
a first action if a distance of the object to a reference point is less than or equal to a minimum threshold distance,
a second action if the distance of the object to the reference point is greater than or equal to a maximum threshold distance different from the minimum threshold distance, or
a third action determined based at least in part on:
simulating the vehicle performing a first simulated action to determine a first cost;
simulating the vehicle performing a second simulated action to determine a second cost; and
determining, as the third action and based at least in part on the first cost being less than or equal to the second cost, the first simulated action; and
causing the vehicle to be controlled according to the action.

7. The method of claim 6, further comprising:
determining a potential collision zone between the vehicle and the object based at least in part on the vehicle trajectory and the predicted object trajectory;
determining a distance between a vehicle location and the potential collision zone,
wherein the first simulated action and the second simulated action are determined based at least in part on the distance between the vehicle location and the potential collision zone.

8. The method of claim 6, wherein each of the first simulated action and the second simulated action comprises one of:
proceeding into a junction associated with the vehicle and the object at a first speed;
proceeding into the junction at a second speed that is greater than the first speed; or
yielding to the object.

9. The method of claim 6, wherein at least one of the first cost or the second cost comprises:
a safety cost;
an occlusion cost;
a comfort cost;
a progress cost; or
an operational rule cost.

10. The method of claim 6, further comprising:
identifying an occlusion zone associated with the environment;
associating a simulated object with a first simulation associated with simulating the vehicle performing the first simulated action and a second simulation associated with simulating the vehicle performing the second simulated action, wherein the simulated object is located in the occlusion zone; and
determining a first occlusion cost associated with the first simulation and a second occlusion cost associated with the second simulation based at least in part on the simulated object,
wherein the first cost comprises the first occlusion cost and the second cost comprises the second occlusion cost.

11. The method of claim 10, wherein determining the first occlusion cost and the second occlusion cost comprises:
determining a first vehicle velocity associated with the first simulated action and a second vehicle velocity associated with the second simulated action;
determining a first progression penalty associated with the first simulated action and a second progression penalty associated with the second simulated action, wherein the first progression penalty and the second progression penalty are based at least in part on squared values of the first vehicle velocity and the second vehicle velocity, respectively; and
determining a first blocking penalty associated with the first simulated action and a second blocking penalty associated with the second simulated action, wherein the first blocking penalty and the second blocking penalty are based at least in part on the values of the first vehicle velocity and the second vehicle velocity, respectively,
wherein the first occlusion cost comprises the first progression penalty and the first blocking penalty and the second occlusion cost comprises the second progression penalty and the second blocking penalty.

12. The method of claim 6, wherein the second simulated action is associated with the vehicle proceeding ahead of the object, the object being a first object and wherein determining the second cost comprises:
determining a second object trajectory associated with a second object in the environment;
determining, based at least in part on the second object trajectory, that the second object is relevant to a path of the vehicle;
determining that a probability that the vehicle will perform a yielding action responsive to the second object at a future time is above a threshold probability; and
determining a penalty associated with the yielding action, wherein the second cost comprises the penalty.

13. The method of claim 6, further comprising:
determining prior to a completion of simulating the vehicle performing the first simulated action that a safety cost associated with the first simulated action is greater than or equal to a threshold safety cost; and
terminating the simulation based at least in part on the safety cost being greater than or equal to the threshold safety cost.

14. The method of claim 6, wherein the first action comprises yielding to the object.

15. One or more non-transitory computer-readable media storing instructions that, when executed, cause one or more processors to perform operations comprising:
determining, based at least in part on sensor data, a predicted object trajectory associated with an object in an environment proximate a vehicle;
determining, based at least in part on the predicted object trajectory and a vehicle trajectory, to perform an action, wherein the action comprises:
a first action if a distance of the object to a reference point is less than or equal to a minimum threshold distance,
a second action if the distance of the object to the reference point is greater than or equal to a maximum threshold distance different from the minimum threshold distance, or
a third action determined based at least in part on:
simulating the vehicle performing a first simulated action to determine a first cost;
simulating the vehicle performing a second simulated action to determine a second cost; and
determining, as the third action and based at least in part on the first cost being less than or equal to the second cost, the first simulated action; and
causing the vehicle to be controlled according to the action.

16. The one or more non-transitory computer-readable media of claim 15, the operations further comprising:
determining a potential collision zone between the vehicle and the object based at least in part on the vehicle trajectory and the predicted object trajectory;
determining a distance between a vehicle location and the potential collision zone, wherein the first simulated action and the second simulated action are determined based at least in part on the distance between the vehicle location and the potential collision zone.

17. The one or more non-transitory computer-readable media of claim 15, wherein each of the first simulated action and the second simulated action comprises one of:
proceeding into a junction associated with the vehicle and the object at a first speed;
proceeding into the junction at a second speed that is greater than the first speed; or
yielding to the object.

18. The one or more non-transitory computer-readable media of claim 15, wherein each of the first cost and the second cost comprises at least one of:
a safety cost;
an occlusion cost;
a comfort cost;
a progress cost; or
an operational rule cost.

19. The one or more non-transitory computer-readable media of claim 15, wherein the second simulated action is associated with the vehicle proceeding ahead of the object, the object being a first object and wherein determining the second cost comprises:
determining a second object trajectory associated with a second object in the environment;
determining, based at least in part on the second object trajectory, that the second object is relevant to a path of the vehicle;
determining that a probability that the vehicle will perform a yielding action in response to the second object at a future time is above a threshold probability; and
determining a penalty associated with the yielding action, wherein the second cost comprises the penalty.

20. The one or more non-transitory computer-readable media of claim 15, the operations further comprising:
determining prior to a completion of simulating the vehicle performing the first simulated action that a safety cost associated with the first simulated action is greater than or equal to a threshold safety cost; and
terminating the simulation based at least in part on the safety cost being greater than or equal to the threshold safety cost.

* * * * *